United States Patent
Nagaoka et al.

(10) Patent No.: US 11,699,600 B2
(45) Date of Patent: Jul. 11, 2023

(54) WAFER PROCESSING APPARATUS AND METHOD FOR PROCESSING WAFER

(71) Applicants: DENSO CORPORATION, Kariya (JP); TOYOTA JIDOSHA KABUSHIKI KAISHA, Toyota (JP); MIRISE Technologies Corporation, Nisshin (JP); National University Corporation Kyoto Institute of Technology, Kyoto (JP)

(72) Inventors: Tatsuji Nagaoka, Nisshin (JP); Hiroki Miyake, Nisshin (JP); Hiroyuki Nishinaka, Kyoto (JP); Yuki Kajita, Kyoto (JP); Masahiro Yoshimoto, Kyoto (JP)

(73) Assignees: DENSO CORPORATION, Kariya (JP); TOYOTA JIDOSHA KABUSHIKI KAISHA, Toyota (JP); MIRISE Technologies Corporation, Nisshin (JP); National University Corporation Kyoto Institute of Technology, Kyoto (JP)

( * ) Notice: Subject to any disclaimer, the term of this patent is extended or adjusted under 35 U.S.C. 154(b) by 32 days.

(21) Appl. No.: 17/522,067

(22) Filed: Nov. 9, 2021

(65) Prior Publication Data
US 2022/0181170 A1    Jun. 9, 2022

(30) Foreign Application Priority Data
Dec. 4, 2020   (JP) .................................. 2020-202094

(51) Int. Cl.
*H01L 21/67* (2006.01)
*H01L 21/02* (2006.01)
*H01L 21/306* (2006.01)

(52) U.S. Cl.
CPC .. *H01L 21/67023* (2013.01); *H01L 21/02623* (2013.01); *H01L 21/30604* (2013.01)

(58) Field of Classification Search
CPC ......... H01L 21/67023; H01L 21/02623; H01L 21/30604; H01L 21/67253;
(Continued)

(56) References Cited

U.S. PATENT DOCUMENTS

2007/0163502 A1* 7/2007 Nozawa ............ H01J 37/32522
                                                        118/723 R
2015/0337442 A1* 11/2015 Agafonov ................ C23C 16/52
                                                        118/695

(Continued)

FOREIGN PATENT DOCUMENTS

JP          2017-110287 A       6/2017
JP          2019-033142 A       2/2019

*Primary Examiner* — Tucker J Wright
*Assistant Examiner* — Azm A Parvez
(74) *Attorney, Agent, or Firm* — Posz Law Group, PLC

(57) ABSTRACT

A wafer processing apparatus is configured to process a wafer by supplying mist to a surface of the wafer. The wafer processing apparatus includes a furnace in which the wafer is disposed, a gas supplying device configured to supply gas into the furnace, a mist supplying device configured to supply the mist into the furnace, and a controller. The controller is configured to execute a processing step by controlling the gas supplying device and the mist supplying device to supply the gas and the mist into the furnace, respectively. The controller is further configured to control the mist supplying device to stop supplying the mist into the furnace while controlling the gas supplying device to keep supplying the gas into the furnace when the processing step ends.

14 Claims, 9 Drawing Sheets

(58) Field of Classification Search
CPC ......... H01L 21/67242; H01L 21/67276; H01L 21/67; H01L 21/67005; H01L 21/67011; H01L 21/67017; H01L 21/30
USPC ........................................................ 438/795
See application file for complete search history.

(56) References Cited

U.S. PATENT DOCUMENTS

| | | |
|---|---|---|
| 2020/0173054 A1 | 6/2020 | Nagaoka et al. |
| 2020/0385884 A1 | 12/2020 | Nagaoka et al. |
| 2020/0388491 A1 | 12/2020 | Nagaoka et al. |

* cited by examiner

WAFER PROCESSING APPARATUS AND METHOD FOR PROCESSING WAFER

CROSS REFERENCE TO RELATED APPLICATION

This application is based on Japanese Patent Application No. 2020-202094 filed on Dec. 4, 2020, the disclosure of which is incorporated herein by reference in its entirety.

TECHNICAL FIELD

The present disclosure relates to a wafer processing apparatus and a method for processing a wafer.

A wafer processing technique for processing a wafer by supplying mist to a surface of the wafer has been known. In this type of technique, the mist is supplied into a furnace housing the wafer. The mist adheres to the surface of the wafer in the furnace. As a result, the wafer is processed.

SUMMARY

A wafer processing apparatus supplies mist to the surface of a wafer to process the wafer. This wafer processing apparatus includes a furnace in which the wafer is arranged, a gas supplying device configured to supply gas into the furnace, a mist supplying device configured to supply the mist into the furnace, and a controller. The controller is configured to execute a processing step by controlling the gas supplying device and the mist supplying device to supply the gas and the mist into the furnace, respectively. The controller is further configured to control the mist supplying device to stop supplying the mist into the furnace while controlling the gas supplying device to keep supplying the gas into the furnace when the processing step ends.

DESCRIPTION OF EMBODIMENTS

Figure 1:
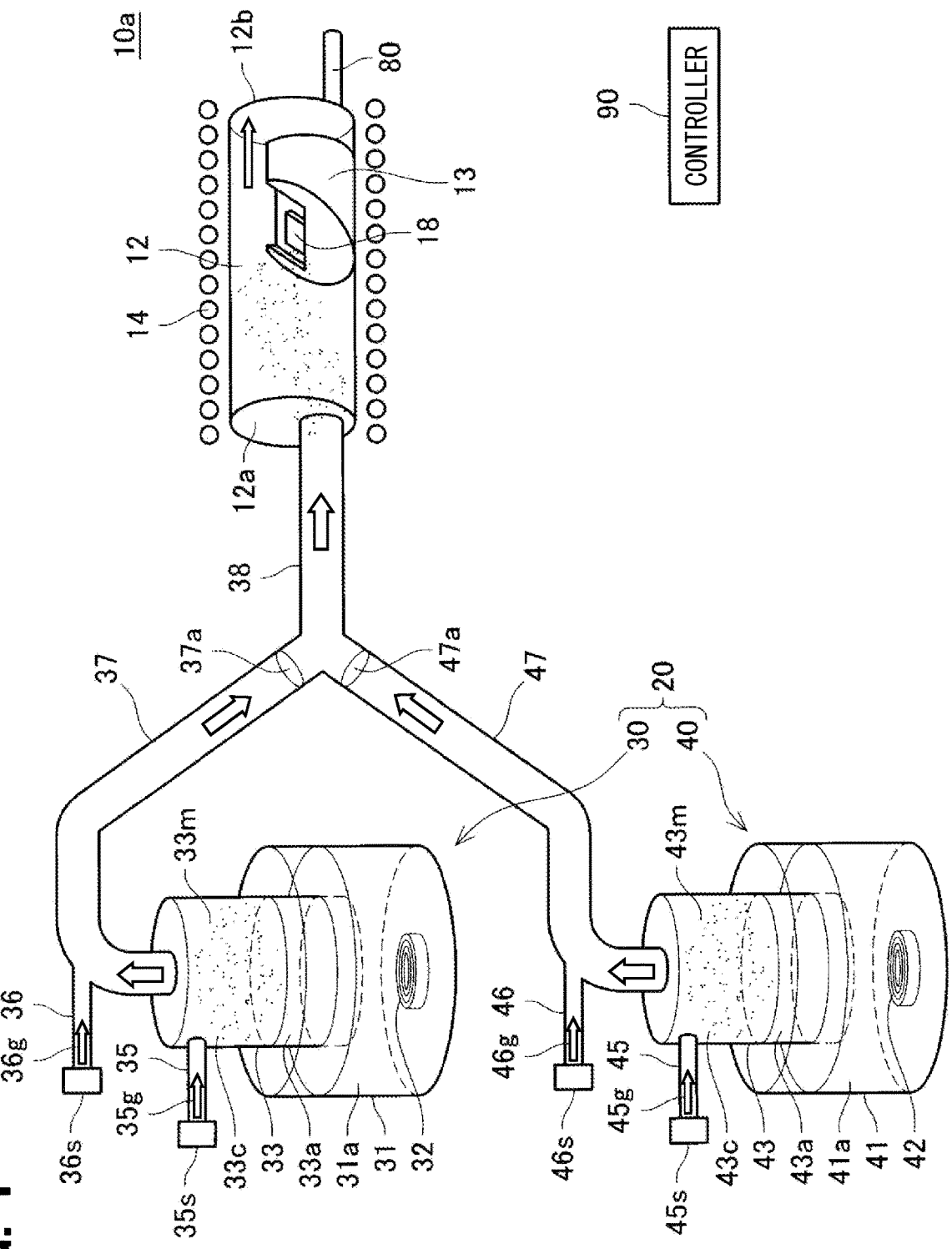
FIG. 1 is a diagram illustrating a wafer processing apparatus of a first embodiment.

To begin with, examples of relevant techniques will be described.

A wafer processing technique for processing a wafer by supplying mist to a surface of the wafer has been known. In this type of technique, the mist is supplied into a furnace housing the wafer. The mist adheres to the surface of the wafer in the furnace. As a result, the wafer is processed. For example, a film forming device supplies mist containing a raw material of gallium oxide to the surface of the wafer to grow a gallium oxide film on the wafer. Further, as a wafer processing technique using mist, there are techniques of etching a wafer by mist, modifying a wafer by mist, and the like.

In the techniques of processing the wafer by mist, gas is flowed through the furnace when the mist is supplied into the furnace. That is, both the mist and the gas flow together through the furnace. The mist flowing together with the gas adheres to the surface of the wafer, so that the wafer is processed.

In the wafer processing technique, when the supply of the gas into the furnace is stopped at the end of the processing, the flow of the mist in the furnace is stopped and the mist drifts in the furnace. When the mist drifting in the furnace adheres to the surface of the wafer, the processing condition on the surface of the wafer is changed and the surface state of the wafer changes. As a result, the surface state of the wafer cannot be controlled to a desired state. The present disclosure proposes a technique for suppressing a change on the surface of the wafer at the end of the wafer processing process.

The wafer processing apparatus disclosed in the present disclosure supplies mist to the surface of a wafer to process the wafer. This wafer processing apparatus includes a furnace in which the wafer is arranged, a gas supplying device configured to supply gas into the furnace, a mist supplying device configured to supply the mist into the furnace, and a controller. The controller is configured to execute a processing step by controlling the gas supplying device and the mist supplying device to supply the gas and the mist into the furnace, respectively. The controller is further configured to control the mist supplying device to stop supplying the mist into the furnace while controlling the gas supplying device to keep supplying the gas into the furnace when the processing step ends.

In the wafer processing apparatus, at the end of the processing process, the mist supplying device stops supplying the mist while the gas supplying device keep supplying the gas into the furnace. Thus, the mist existing in the wafer processing apparatus at the end of the processing step is flowed out of the furnace by the gas. Thus, it is possible to restrict the mist that has lost the moving speed from drifting in the furnace. Therefore, according to this wafer processing apparatus, it is possible to suppress a change in the surface state of the wafer at the end of the wafer processing step. Therefore, it is easy to control the surface state of the wafer to a desired state.

The technical elements disclosed herein are listed below. The following technical elements are useful independently.

In the wafer processing apparatus disclosed in the present disclosure, a mist supplying device may be a first mist supplying device, mist may be a first mist, and a processing step may be a first processing step. The wafer processing apparatus may further include a second mist supplying device configured to supply a second mist into the furnace. The controller may execute a second processing step after the first processing step. In the second processing step, the controller may control the gas supplying device and the second mist supplying device to supply the gas and the mist into the furnace, respectively, at the same time. The controller may control the second mist supplying device to start supplying the second mist into the furnace while controlling the gas supplying device to keep supplying the gas into the furnace when the second processing step starts.

According to this wafer processing apparatus, it is possible to restrict the second mist having a low moving speed from adhering to the surface of the wafer at the start of the second processing step. Thus, when the second processing step starts, it is easy to control the surface state of the wafer to a desired state.

In the wafer processing apparatus disclosed in the present disclosure, the controller may control the gas supplying device to keep supplying the gas into the furnace during a transition period between the first processing step and the second processing step.

According to this configuration, since the flow of the gas is not interrupted between the first processing step and the second processing step, it is easy to control the surface state of the wafer to the desired state.

In the wafer processing apparatus disclosed in the present disclosure, the gas supplied by the gas supplying device during the first processing step and the gas supplied by the gas supplying device during the second processing step may be a common gas. The controller may control the gas supplying device to keep supplying the common gas into the furnace from the first processing step to the second processing step.

According to this configuration, the first processing step can be shifted to the second processing step without stopping the flow of the gas.

Further, in another example of the wafer processing apparatus disclosed in the present disclosure, the gas supplying device may include a first gas supplying device configured to supply a first gas into the furnace and a second gas supplying device configured to supply a second gas into the furnace. In the first processing step, the controller may control the first gas supplying device to supply the first gas into the furnace. In the second processing step, the controller may control the second gas supplying device to supply the second gas into the furnace. During the transition period from the first processing step to the second processing step, the controller may execute a gas switching control by controlling the second gas supplying device to start supplying the second gas into the furnace while controlling the first gas supplying device to keep supplying the first gas into the furnace, and then controlling the first gas supplying device to stop supplying the first gas into the furnace while controlling the second gas supplying device to keep supplying the second gas into the furnace.

According to this configuration, during the transition period from the first processing step to the second processing step, the first gas can be replaced with the second gas without stopping a flow of gas in the furnace.

In the wafer processing apparatus disclosed in the present disclosure, the controller may execute the gas switching control after controlling the first mist supplying device to decrease an amount of the first mist supplied into the furnace. That is, a timing at which a supply amount of the second gas exceeds a supply amount of the first gas (i.e., a timing of gas switching control) may be later than a timing at which the supply amount of the first mist starts to decrease.

In the wafer processing apparatus disclosed in the present disclosure, the controller may execute the gas switching control before controlling the second mist supplying device to increase an amount of the second mist supplied into the furnace. That is, the timing at which the supply amount of the second gas exceeds the supply amount of the first gas may be before the timing at which the supply amount of the second mist starts to increase.

In the wafer processing apparatus disclosed in the present disclosure, the controller may execute the gas switching control before controlling the first mist supplying device to decrease an amount of the first mist supplied into the furnace. That is, the timing at which the supply amount of the second gas exceeds the supply amount of the first gas may be before the timing at which the supply amount of the first mist starts to decrease.

In the wafer processing apparatus disclosed in the present disclosure, the controller may execute the gas switching control after controlling the second mist supplying device to increase an amount of the second mist supplied into the furnace. That is, the timing at which the supply amount of the second gas exceeds the supply amount of the first gas may be after the timing at which the supply amount of the second mist starts to increase.

As described above, timings of changing the supply amounts of the mists and timing of executing the gas switching control are arbitrarily determined.

In the wafer processing apparatus disclosed in the present disclosure, during the transition period from the first processing step to the second processing step, the controller may control the second mist supplying device to start supplying the second mist into the furnace after controlling the first mist supplying device to stop supplying the first mist into the furnace.

In this way, an interval may be provided between the period for supplying the first mist and the period for supplying the second mist. For example, when one of the first processing step and the second processing step is an etching step and the other is a film forming step, the first mist (i.e., an etching solution) and the second mist (i.e., a raw material of the film) are restricted from being mixed with each other. Thus, it is possible to prevent unintended reaction from occurring in the furnace.

In another example of the wafer processing apparatus disclosed in the present disclosure, during the transition period from the first processing step to the second processing step, the controller may control the second mist supplying device to start supplying the second mist into the furnace while controlling the first mist supplying device to keep supplying the first mist into the furnace, and then control the first mist supplying device to stop supplying the first mist into the furnace while controlling the second mist supplying device to keep supplying the second mist into the furnace.

In this way, during the transition period from the first processing step to the second processing step, both the first mist and the second mist may be supplied into the furnace temporarily. For example, when both the first processing step and the second processing step are film forming steps and both the first mist and the second mist are temporarily supplied into the furnace, a mixed crystal film is formed at the interface between the film formed in the first processing step and the film formed in the second processing step. As a result, crystal defects at the interface can be reduced.

When both the first mist and the second mist are temporarily supplied into the furnace, during the transition period from the first processing step to the second processing step, the controller may decrease the supply amount of the first mist from the first value to the second value, keep the supply amount at the second value for a first period, and then stop the supply of the first mist. Further, during the transition period from the first processing step to the second processing step, the controller may start the supply of the second mist, keep the supply amount of the second mist at the third value for a second period, and increase the supply amount to the fourth value. The first period for keeping the supply amount of the first mist at the second value and the second period for keeping the supply amount of the second mist at the third value may overlap with each other.

According to this configuration, both the first mist and the second mist can be supplied into the furnace in low supply amounts.

In the wafer processing apparatus disclosed in the present disclosure, the first processing step may be a step of etching the wafer, a step of forming a film on the wafer, or a step of modifying the wafer. Further, the second processing step may be a step of etching the wafer, a step of forming a film on the wafer, or a step of modifying the wafer.

For example, the first processing step may be an etching step of the wafer and the second processing step may be a film growing step on the wafer.

According to this configuration, a film can be grown on the surface of the clean wafer that has been etched.

Further, for example, the first processing step may be a film forming step on the wafer, and the second processing step may be an etching step of the film.

According to this configuration, after the film is grown on the wafer, the surface of the film can be etched to control the surface state.

Further, for example, the first processing step may be a first film forming step on the wafer, and the second processing step may be a second film forming step on the first film.

According to this configuration, multiple films can be laminated and grown on the wafer. The materials of the first film and the second film may be the same or different. Even if the materials of the first film and the second film are the same, the properties of these films can be made different by changing the growth conditions between the first film and the second film.

Further, for example, the first processing step may be a film growing step on the wafer, and the second processing step may be a modifying step of the film.

According to this configuration, the grown film can be modified to have a desired property.

Further, for example, the first processing step may be a modifying step of the wafer, and the second processing step may be a film forming step on the wafer.

According to this configuration, the wafer can be modified to have an intended characteristic before growing the film.

In the wafer processing apparatus disclosed in the present disclosure, the surface of the wafer may be tilted with respect to the flow direction of the gas in the furnace.

In this type of wafer processing apparatus, since the angle at which the mist collides with the wafer is intentionally adjusted, desired characteristics may not be obtained when the mist collide with the wafer at an unintended angle. Thus, when the mist drifts in the furnace during the transition period between the steps, a problem is likely to occur. Thus, it is more effective to apply the techniques disclosed herein to this type of wafer processing apparatus.

An example of the wafer processing apparatus disclosed in the present disclosure may include a gas supply pipe through which the gas flows from the gas supplying device into the furnace, a first mist supply pipe connected to the first mist supplying device, a second mist supply pipe connected to the second mist supplying pipe, and a common mist pipe. The common mist pipe includes an upstream end at which the first mist supply pipe merges with the second mist supply pipe and a downstream end connected to the gas supply pipe.

In this way, the first mist and the second mist may be supplied from the common mist supply pipe into the gas supply pipe.

An example of the wafer processing apparatus disclosed in the present disclosure may include a gas supply pipe through which the gas is supplied from the gas supplying device into the furnace, a first mist supply pipe, and a second mist supply pipe. The first mist supply pipe has an upstream end connected to the first mist supplying device and a downstream end connected to the gas supply pipe. The second mist supply pipe has an upstream end connected to the second mist supplying device and a downstream end connected to the gas supply pipe.

In this way, the first mist and the second mist may be separately supplied into the gas supply pipe from different supply pipes. In this case, a connection position between the second mist supply pipe and the gas supply pipe may be located at a position upstream of a connection position between the first mist supply pipe and the gas supply pipe.

In this configuration, during the first processing step, the first mist adheres to the inside of the gas supply pipe at a position downstream of the connection position between the first mist supply pipe and the gas supply pipe. During the second processing step after the first processing step, the second mist flows through the gas supply pipe at a position downstream of the connection position between the second mist supply pipe and the gas supply pipe. In this configuration, since the first mist adheres only to an inner surface of a portion (the most downstream portion) of the gas supply pipe through which the second mist flows, the first mist adhering to the inner surface of the gas supply pipe is less likely to affect the second mist flowing through the gas supply pipe.

In an example of the wafer processing apparatus disclosed in the present disclosure, as for the connection position between the gas supply pipe and the mist supply pipe (i.e., the first mist supply pipe, the second mist supply pipe, or the common mist supply pipe), an angle (hereinafter, referred to as a first angle) between an upstream portion of the gas supply pipe on the upstream side of the connection position and a downstream portion of the gas supply pipe on the downstream side of the connection position may be 135° or more.

The flows of the gas and the mist are less likely to be disturbed in the gas supply pipe when the upstream portion of the gas supply pipe and the downstream portion of the gas supply pipe extend as straight as possible at the connection position between the gas supply pipe and the mist supply pipe.

In an example of the wafer processing apparatus disclosed in the present disclosure, as for the connection position between the gas supply pipe and the mist supply pipe (i.e., the first mist supply pipe, the second mist supply pipe, or the common mist supply pipe), an angle (hereinafter, referred to as a second angle) between a downstream portion of the gas supply pipe on the downstream side of the connection position and the mist supply pipe may be 90° or more.

The flows of the gas and the mist are less likely to be disturbed in the gas supply pipe when the mist supply pipe is diagonally fluidly connected to the gas supply pipe at the connection position between the gas supply pipe and the mist supply pipe such that the mist can merge into the flow of the gas.

In an example of the wafer processing apparatus disclosed in the present disclosure, the first angle may be larger than the second angle.

In an example of the wafer processing apparatus disclosed in the present disclosure, the surface of the wafer may have recesses. For example, the wafer may have a semiconductor substrate and a mask provided on the surface of the semiconductor substrate, and opening portions of the mask may form the recesses of the wafer.

In the wafer having the surface provided with the recesses, when the flow of the gas is stopped, a liquid composed of the mist adhering to the surface of the wafer is likely to be collected in the recesses. Thus, by applying the technique disclosed in the present disclosure to such a wafer, it is possible to suppress the accumulation of the liquid in the recesses. As a result, the wafer can be processed more preferably.

The wafer processing apparatus of the embodiment processes a wafer by supplying mist to the surface of the wafer. Wafer processing includes film formation, etching, modification and the like. In the wafer processing apparatus of the embodiment, the first processing step and the second processing step are performed in order. Mist is supplied to the surface of the wafer in each of the first processing step and the second processing step. The mist used in the first processing step and the mist used in the second processing step may be different or the same. First, the configuration of the wafer processing apparatus will be described. Hereinafter, the wafer processing apparatus of the first embodiment, the second embodiment, and the third embodiment will be described.

(Wafer Processing Apparatus of the First Embodiment)

FIG. 1 illustrates a wafer processing apparatus 10a of the first embodiment. The wafer processing apparatus 10a includes a furnace 12, a heater 14, a gas-mist supplying device 20, a discharge pipe 80, and a controller 90.

The furnace 12 houses therein a wafer stage 13. A wafer 18 is placed on the wafer stage 13. The heater 14 is arranged around the furnace 12 and configured to heat the furnace 12. When the heater 14 heats the furnace 12, the wafer 18 in the furnace 12 is heated. The gas-mist supplying device 20 is connected to an upstream end 12a of the furnace 12. The discharge pipe 80 is connected to a downstream end 12b of the furnace 12. The gas-mist supplying device 20 is configured to supply mist together with gas into the furnace 12. The mist and the gas supplied from the gas-mist supplying device 20 into the furnace 12 flow through the furnace 12 from the upstream end 12a to the downstream end 12b, and then flow out of the furnace 12 through the discharge pipe 80. Further, the gas-mist supplying device 20 can also supply the gas only into the furnace 12. The wafer stage 13 supports the wafer 18 so that the surface of the wafer 18 faces the flow direction of the mist and the gas in the furnace 12 (i.e., the direction from the upstream end 12a to the downstream end 12b). The wafer stage 13 supports the wafer 18 so that the surface of the wafer 18 is tilted relative to the flow direction of the mist and the gas in the furnace 12. The controller 90 controls each component of the wafer processing apparatus 10a.

The gas-mist supplying device 20 includes mist supplying devices 30 and 40.

The mist supplying device 30 includes a water tank 31, an ultrasonic vibrator 32, and a solution storage tank 33. The water tank 31 is a container opening at an upper part and stores water 31a therein. The ultrasonic vibrator 32 is disposed on the bottom surface of the water tank 31. The ultrasonic vibrator 32 applies ultrasonic vibration to the water 31a in the water tank 31. The solution storage tank 33 is a closed container. The solution storage tank 33 stores a solution 33a. The solution 33a is a source of the mist to be supplied into the furnace 12. The bottom of the solution storage tank 33 is immersed in the water 31a in the water tank 31. The bottom surface of the solution storage tank 33 is made of a film. As a result, ultrasonic vibration is easily transmitted from the water 31a in the water tank 31 to the solution 33a in the solution storage tank 33. When the ultrasonic vibrator 32 applies ultrasonic vibration to the water 31a in the water tank 31, the ultrasonic vibration is transmitted to the solution 33a via the water 31a. Then, the surface of the solution 33a vibrates, so that a mist 33m of the solution 33a is generated in a space 33c above the solution 33a (i.e., the space in the solution storage tank 33).

The gas-mist supplying device 20 further includes a carrier gas supply pipe 35, a carrier gas supplying device 35s, a dilution gas supply pipe 36, a dilution gas supplying device 36s, a mist supply pipe 37, and a common mist supply pipe 38. The mist supply pipe 37 has an upstream end connected to an upper part of the solution storage tank 33. The mist supply pipe 37 has a downstream end connected to an upstream end of the common mist supply pipe 38. The common mist supply pipe 38 has a downstream end connected to the upstream end 12a of the furnace 12. The carrier gas supplying device 35s is connected to the upper part of the solution storage tank 33 via the carrier gas supply pipe 35. The carrier gas supplying device 35s is configured to supply a carrier gas 35g into the solution storage tank 33 (more specifically, the space 33c above the solution 33a). The dilution gas supplying device 36s is connected to the mist supply pipe 37 via the dilution gas supply pipe 36. The dilution gas supplying device 36s is configured to supply a dilution gas 36g into the mist supply pipe 37.

The mist supplying device 40 includes a water tank 41, an ultrasonic vibrator 42, and a solution storage tank 43. The water tank 41 is a container opening at an upper part and stores water 41a therein. The ultrasonic vibrator 42 is disposed on the bottom surface of the water tank 41. The ultrasonic vibrator 42 applies ultrasonic vibration to the water 41a in the water tank 41. The solution storage tank 43 is a closed container. The solution storage tank 43 stores a solution 43a. The solution 43a is a source of the mist to be supplied into the furnace 12. The bottom of the solution storage tank 43 is immersed in the water 41a in the water tank 41. The bottom surface of the solution storage tank 43 is made of a film. As a result, ultrasonic vibration is easily transmitted from the water 41a in the water tank 41 to the solution 43a in the solution storage tank 43. When the ultrasonic vibrator 42 applies ultrasonic vibration to the water 41a in the water tank 41, the ultrasonic vibration is transmitted to the solution 43a via the water 41a. Then, the surface of the solution 43a vibrates, and a mist 43m of the solution 43a is generated in the space 43c above the solution 43a (i.e., the space in the solution storage tank 43).

The gas-mist supplying device 20 further includes a carrier gas supply pipe 45, a carrier gas supplying device 45s, a dilution gas supply pipe 46, a dilution gas supplying device 46s, and a mist supply pipe 47. The upstream end of the mist supply pipe 47 is connected to an upper portion of the solution storage tank 43. The downstream end of the mist supply pipe 47 is connected to the upstream end of the common mist supply pipe 38. That is, the mist supply pipe 37 and the mist supply pipe 47 merge at the upstream end of the common mist supply pipe 38. The carrier gas supplying device 45s is connected to the upper portion of the solution storage tank 43 through the carrier gas supply pipe 45. The carrier gas supplying device 45s is configured to supply a carrier gas 45g into the solution storage tank 43 (more specifically, the space 43c above the solution 43a). The dilution gas supplying device 46s is connected to the mist supply pipe 47 through the dilution gas supply pipe 46. The dilution gas supplying device 46s is configured to supply a dilution gas 46g into the mist supply pipe 47.

The gas-mist supplying device 20 further includes switching valves 37a and 47a. The switching valve 37a is configured to selectively open and close the mist supply pipe 37. The switching valve 47a is configured to selectively open and close the mist supply pipe 47. The switching valves 37a and 47a can change flow passages through which the mist or the gas flows.

The controller 90 controls the ultrasonic vibrators 32 and 42, the switching valves 37a and 47a, and the heater 14. Further, the controller 90 controls the carrier gas supplying device 35s, the dilution gas supplying device 36s, the carrier gas supplying device 45s, and the dilution gas supplying device 46s, thereby controlling flow rates of the carrier gas 35g, the dilution gas 36g, the carrier gas 45g, and the dilution gas 46g.

As described above, the wafer processing apparatus 10a performs the first processing step and the second processing step. From the start of the first processing step to the end of the second processing step, the heater 14 heats the wafer 18. In the first processing step, the controller 90 operates the ultrasonic vibrator 32 to generate the mist 33m in the space 33c in the solution storage tank 33. At the same time, the controller 90 supplies the carrier gas 35g into the solution storage tank 33 through the carrier gas supply pipe 35, and supplies the dilution gas 36g into the solution storage tank 33 through the dilution gas supply pipe 36. The carrier gas 35g flows into the mist supply pipe 37 through the solution storage tank 33. At this time, the mist 33m in the solution storage tank 33 flows into the mist supply pipe 37 together with the carrier gas 35g. Further, the dilution gas 36g is mixed with the mist 33m in the mist supply pipe 37. Thereby, the mist 33m is diluted. The mist 33m flows through the mist supply pipe 37 toward the downstream side together with the gas (i.e., the carrier gas 35g and the dilution gas 36g), and flows into the furnace 12 through the common mist supply pipe 38. In the furnace 12, the mist 33m flows to the downstream end 12b of the furnace 12 together with the gas and is discharged to the discharge pipe 80. When the surface of the wafer 18 is exposed to the mist 33m in the furnace 12, the state of the wafer 18 changes.

Further, the controller 90 can control at least one of the carrier gas 35g and the dilution gas 36g to flow while stopping the ultrasonic vibrator 32. Since the mist 33m is not generated in this state, gas containing no mist 33m (i.e., at least one of the carrier gas 35g and the dilution gas 36g) is supplied into the furnace 12.

In the second processing step, the controller 90 operates the ultrasonic vibrator 42 to generate the mist 43m in the space 43c in the solution storage tank 43. At the same time, the controller 90 supplies the carrier gas 45g into the solution storage tank 43 through the carrier gas supply pipe 45, and supplies the dilution gas 46g into the mist supply pipe 47 through the dilution gas supply pipe 46. The carrier gas 45g flows into the mist supply pipe 47 through the solution storage tank 43. At this time, the mist 43m in the solution storage tank 43 flows into the mist supply pipe 47 together with the carrier gas 45g. Further, the dilution gas 46g is mixed with the mist 43m in the mist supply pipe 47. Thereby, the mist 43m is diluted. The mist 43m flows through the mist supply pipe 47 toward the downstream side together with the gas (i.e., the carrier gas 45g and the dilution gas 46g), and flows into the furnace 12 through the common mist supply pipe 38. In the furnace 12, the mist 43m flows to the downstream end 12b together with the gas and is discharged to the discharge pipe 80. When the surface of the wafer 18 is exposed to the mist 43m in the furnace 12, the state of the wafer 18 changes.

Further, the controller 90 can control at least one of the carrier gas 45g and the dilution gas 46g to flow while stopping the ultrasonic vibrator 42. Since the mist 43m is not generated in this state, gas containing no mist 43m (i.e., at least one of the carrier gas 45g and the dilution gas 46g) is supplied into the furnace 12.

In the following, the gas supplied to the furnace 12 during the first processing step is referred to as a first gas, and the gas supplied to the furnace 12 during the second processing step is referred to as a second gas. In the above operation of the first embodiment, the first gas is the carrier gas 35g and the dilution gas 36g, and the second gas is the carrier gas 45g and the dilution gas 46g. If the dilution of the mist 33m is not necessary, the gas-mist supplying device 20 does not have to include the dilution gas supplying device 36s. In this case, the first gas is the carrier gas 35g. Further, if the dilution of the mist 43m is not necessary, the gas-mist supplying device 20 does not have to include the dilution gas supplying device 46s. In this case, the second gas is the carrier gas 45g.

(Wafer Processing Apparatus of the Second Embodiment)

Figure 2:
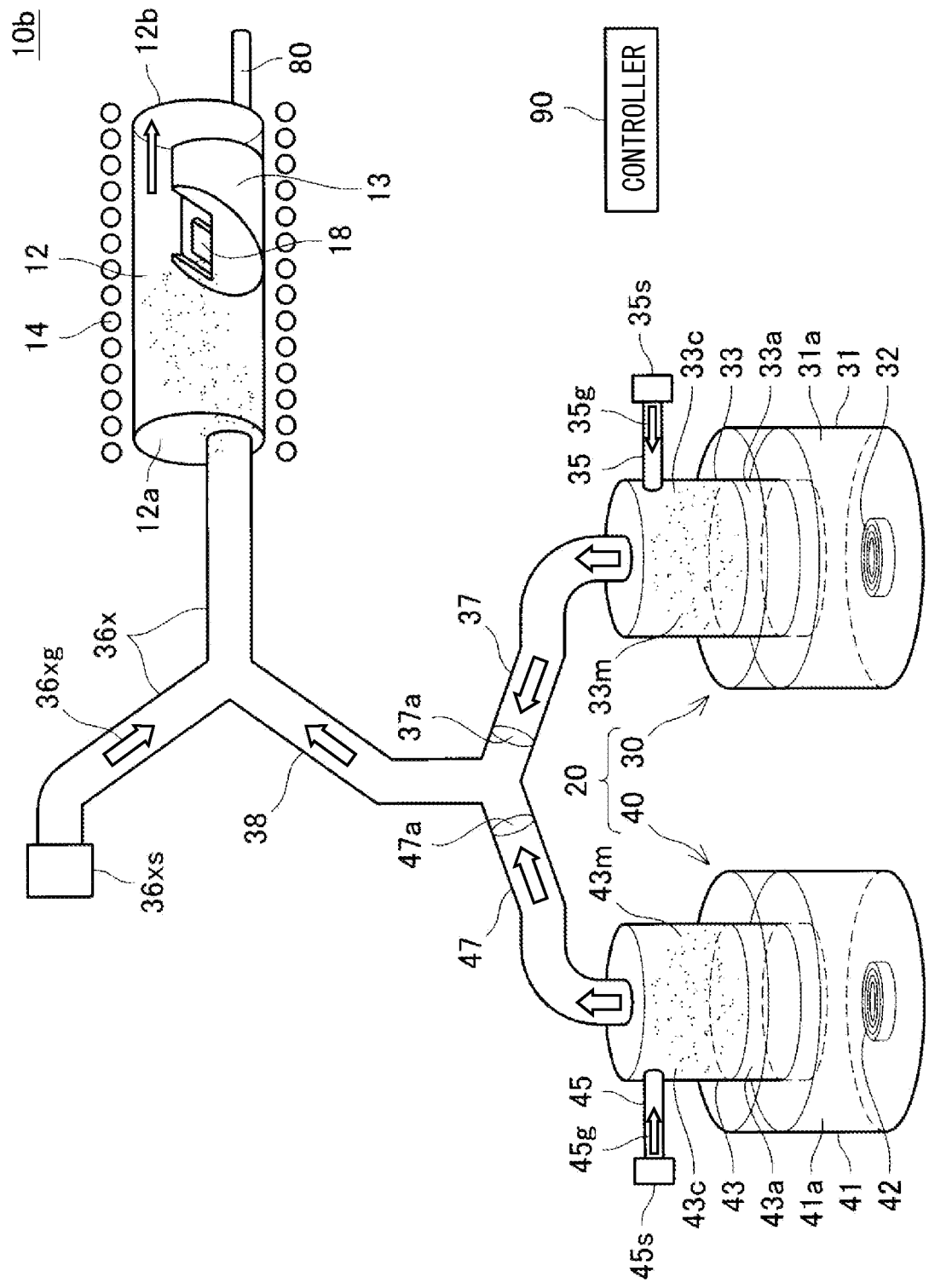
FIG. 2 is a diagram illustrating a wafer processing apparatus of a second embodiment.

FIG. 2 illustrates a wafer processing apparatus 10b of the second embodiment. The wafer processing apparatus 10b of the second embodiment is different from the wafer processing apparatus 10a of the first embodiment in flow passages of the mist and the gas. Other configurations are the same between the first embodiment and the second embodiment.

The wafer processing apparatus 10b of the second embodiment has a gas supply pipe 36x and a gas supplying device 36xs. The upstream end of the gas supply pipe 36x is connected to the gas supplying device 36xs. The downstream end of the gas supply pipe 36x is connected to the upstream end 12a of the furnace 12. The gas supplying device 36xs is configured to supply a gas 36xg into the furnace 12 through the gas supply pipe 36x. The controller 90 controls the flow rate of the gas 36xg by controlling the gas supplying device 36xs. The downstream end of the common mist supply pipe 38 is connected to a middle of the gas supply pipe 36x.

The wafer processing apparatus 10b of the second embodiment also performs the first processing step and the second processing step.

In the first processing step, the controller 90 supplies the mist 33m to the gas supply pipe 36x together with the carrier gas 35g. Further, the controller 90 supplies the gas 36xg to the gas supply pipe 36x. The gas 36xg is mixed with the mist 33m in the gas supply pipe 36x. Thereby, the mist 33m is diluted. The mist 33m is supplied into the furnace 12 together with the gas (i.e., the carrier gas 35g and the gas 36xg). As a result, the surface of the wafer 18 is exposed to the mist 33m, and the state of the wafer 18 changes.

In the second processing step, the controller 90 supplies the mist 43m to the gas supply pipe 36x together with the carrier gas 45g. Further, the controller 90 supplies the gas 36xg to the gas supply pipe 36x. The gas 36xg is mixed with the mist 43m in the gas supply pipe 36x. Thereby, the mist 43m is diluted. The mist 43m is supplied into the furnace 12 together with the gas (i.e., the carrier gas 45g and the gas 36xg). As a result, the surface of the wafer 18 is exposed to the mist 43m, and the state of the wafer 18 changes.

(Wafer Processing Apparatus of the Third Embodiment)

Figure 3:
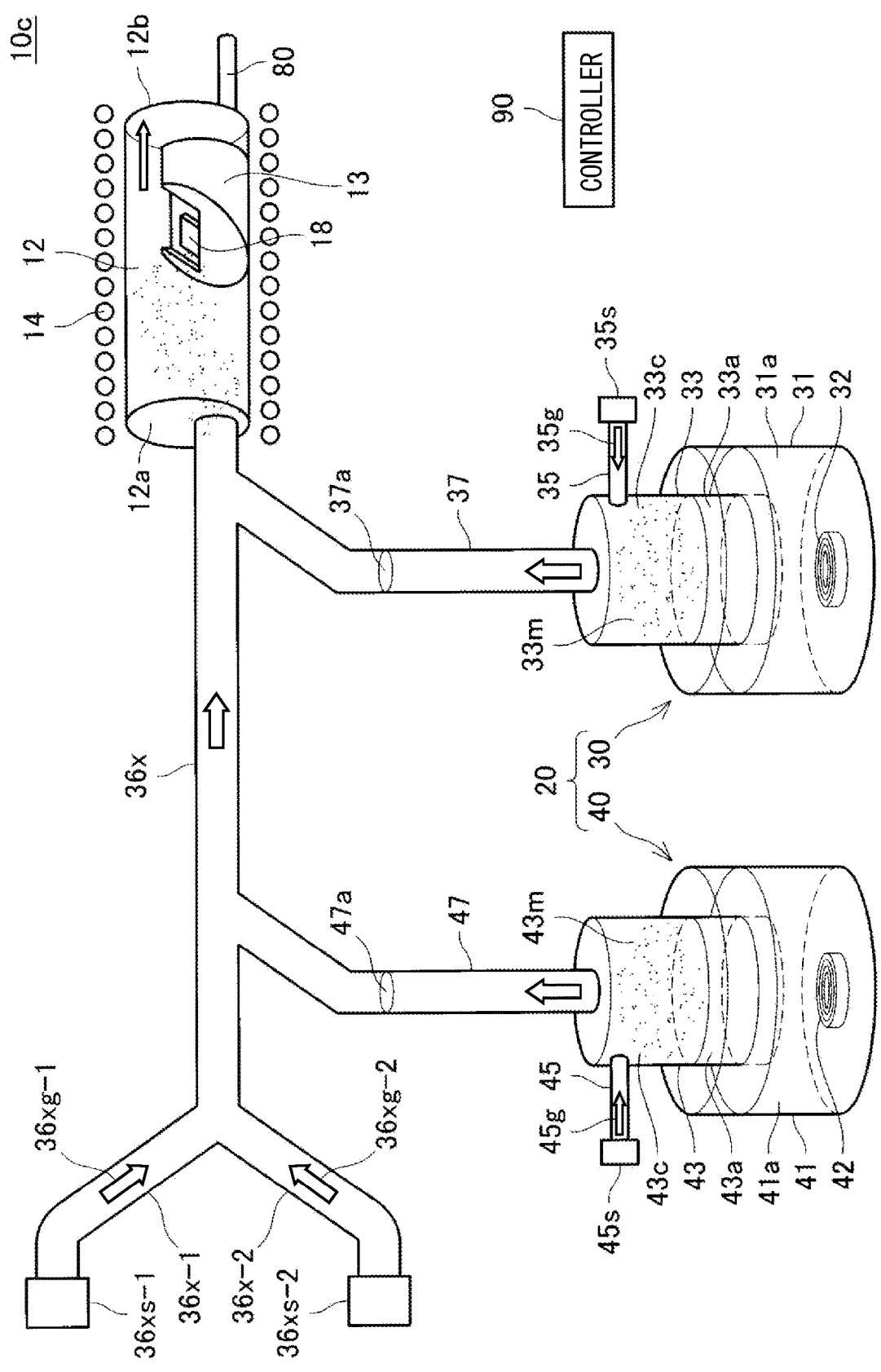
FIG. 3 is a diagram illustrating a wafer processing apparatus of a third embodiment.

FIG. 3 illustrates a wafer processing apparatus 10c of the third embodiment. The wafer processing apparatus 10c of the third embodiment is different from the wafer processing apparatus 10b of the second embodiment in flow passages of the mist and the gas, and other configurations are the same between the second embodiment and the third embodiment.

In the wafer processing apparatus 10c of the third embodiment, the upstream portion of the gas supply pipe 36x is branched into a first supply pipe 36x-1 and a second supply pipe 36x-2. The upstream end of the first supply pipe 36x-1 is connected to a gas supplying device 36xs-1. The gas supplying device 36xs-1 is configured to supply a gas 36xg-1 to the furnace 12 through the first supply pipe 36x-1 and the gas supply pipe 36x. The upstream end of the second supply pipe 36x-2 is connected to a gas supplying device 36xs-2. The gas supplying device 36xs-2 is configured to supply a gas 36xg-2 to the furnace 12 through the second supply pipe 36x-2 and the gas supply pipe 36x. Thus, in the wafer processing apparatus 10c of the third embodiment, kinds of gas flowing through the gas supply pipe 36x can be changed. The controller 90 controls the flow rates of the gas 36xg-1 and the gas 36xg-2 by controlling the gas supplying devices 36xs-1 and 36xs-2.

Further, the wafer processing apparatus 10c of the third embodiment does not have the common mist supply pipe 38. The mist supply pipe 37 is directly connected to the gas supply pipe 36x, and the mist supply pipe 47 is directly connected to the gas supply pipe 36x. The mist supply pipe 37 and the mist supply pipe 47 are connected to the gas supply pipe 36x at positions downstream of a confluence of the first supply pipe 36x-1 and the second supply pipe 36x-2. The confluence of the mist supply pipe 47 and the gas supply pipe 36x is located upstream of a confluence of the mist supply pipe 37 and the gas supply pipe 36x.

The wafer processing apparatus 10c of the third embodiment also performs the first processing step and the second processing step.

In the first processing step, the controller 90 supplies the mist 33m to the gas supply pipe 36x together with the carrier gas 35g. Further, the controller 90 supplies the gas 36xg-1 to the gas supply pipe 36x. The gas 36xg-1 is mixed with the mist 33m in the gas supply pipe 36x. Thereby, the mist 33m is diluted. The mist 33m is supplied into the furnace 12 together with the gas (i.e., the carrier gas 35g and the gas 36xg-1). As a result, the surface of the wafer 18 is exposed to the mist 33m, and the state of the wafer 18 changes.

In the second processing step, the controller 90 supplies the mist 43m to the gas supply pipe 36x together with the carrier gas 45g. Further, the controller 90 supplies the gas 36xg-2 to the gas supply pipe 36x. The gas 36xg-2 is mixed with the mist 43m in the gas supply pipe 36x. Thereby, the mist 43m is diluted. The mist 43m is supplied into the furnace 12 together with the gas (i.e., the carrier gas 45g and the gas 36xg-2). As a result, the surface of the wafer 18 is exposed to the mist 43m, and the state of the wafer 18 changes.

In the above operation of the third embodiment, the first gas is the carrier gas 35g and the gas 36xg-1, and the second gas is the carrier gas 45g and the gas 36xg-2.

The first processing step and the second processing step can be any of an etching step, a film forming step, a modifying step, and other steps. Hereinafter, examples of a combination of the first processing step and the second processing step will be described.

(First Example of Process Combination)

In the first combination example, the first processing step is an etching step, and the second processing step is a film forming step. In the first processing step, a solution that etches the surface of the wafer 18 is used as the solution 33a (i.e., the mist 33m). When the mist 33m adheres to the surface of the wafer 18, the surface of the wafer 18 is etched. By etching the surface of the wafer 18 in this way, defects and the like on the surface of the wafer 18 can be removed. In the second processing step, a solution that crystallizes when being heated is used as the solution 43a (i.e., the mist 43m). When the mist 43m adheres to the wafer 18 and is heated, a crystal film grows on the wafer 18. The second processing step is a so-called mist chemical vapor deposition (CVD) step. As described above, when the film forming step is performed after the etching step, a crystal film having high crystallinity can be grown on the clean wafer 18 that has been etched.

(Second Example of Process Combination)

In the second combination example, the first processing step is a film forming step, and the second processing step is an etching step. In the first processing step, a crystal film is grown on the wafer 18. In the second processing step, a solution that etches the surface of the wafer 18 (i.e., the surface of the crystal film grown in the first processing step) is used as the solution 43a (i.e., the mist 43m). When the mist 43m adheres to the surface of the crystal film, the surface of the crystal film is etched. By etching the surface of the crystal film in this way, the surface of the crystal film can be cleaned. For example, when the film forming condition changes temporarily at the end of the first processing step, crystal defects may occur on the outermost surface of the crystal film. In such case, the outermost surface of the crystal film is etched in the second processing step to remove the crystal defects existing on the outermost surface.

(Third Example of Process Combination)

In the third combination example, the first processing step is a film forming step of growing a first crystal film on the wafer, and the second processing step is a film forming step of growing a second crystal film on the wafer (i.e., on the first crystal film). According to this configuration, multiple crystal films can be laminated on the wafer.

(Fourth Example of Process Combination)

In the fourth combination example, the first processing step is a film forming step, and the second processing step is a modifying step. In the film forming step, a crystal film composed of a material containing oxygen atoms is grown on the wafer. In the modifying step, a material containing oxygen atoms is used as the solution 43a (i.e., as the mist 43m). In the crystal film formed in the first processing step, there are oxygen deficiencies (i.e., defects that vacant oxygen atom sites in which oxygen atoms do not exist are defined). In the second processing step, such oxygen deficiencies in the crystal film are reduced by supplying the mist 43m containing oxygen atoms to the crystal film. Thereby, a crystal film having high crystallinity can be obtained.

(Fifth Example of Process Combination)

In the fifth combination example, the first processing step is a modifying step, and the second processing step is a film forming step. Further, in the fifth combination example, the wafer 18 is made from a material containing oxygen atoms. In the modifying step, a material containing oxygen atoms is used as the solution 33a (i.e., as the mist 33m). In the modifying step, the crystallinity of the wafer 18 is improved by reducing the oxygen deficiencies in the wafer 18. In the second processing step, a crystal film is grown on the wafer 18 having improved crystallinity. Thus, a high quality crystal film can be obtained.

Next, control patterns of the supply amounts of the mist and the gas at a transition period between the first processing step and the second processing step will be described. FIGS. 4 to 10 illustrate changes in the supply amounts of the mist and the gas during the transition period between the first processing step and the second processing step in each control pattern. In FIGS. 4 to 10 and other graphs, a period T1 in which the mist 33m and the gas are stably flowing is the period in which the first processing step is performed, and a period T2 in which the mist 43m and the gas are stably flowing is the period in which the second processing step is performed. A period Tc between the first processing step and the second processing step is the transition period in which the first processing step is switched to the second processing step. A timing to is a timing when the supply amount of the mist 33m starts to decrease, a timing tb is a timing when the supply of the mist 33m is stopped, a timing tc is a timing when the supply of the mist 43m is started, and a timing td is a timing when the supply amount of the mist 43m is increased to a stable value. A timing t1 is a timing when the supply amount of the first gas starts to decrease, a timing t2 is a timing when the supply of the first gas is stopped, a timing t3 is a timing when the supply of the second gas is started, and a timing t4 is a timing when the supply amount of the second gas is increased to a stable value. The control patterns shown in FIGS. 4 to 10 can be performed by any of the wafer processing apparatuses 10a to 10c of the first to third embodiments described above, but may be performed by another wafer processing apparatus.

(First Control Pattern)

Figure 4:
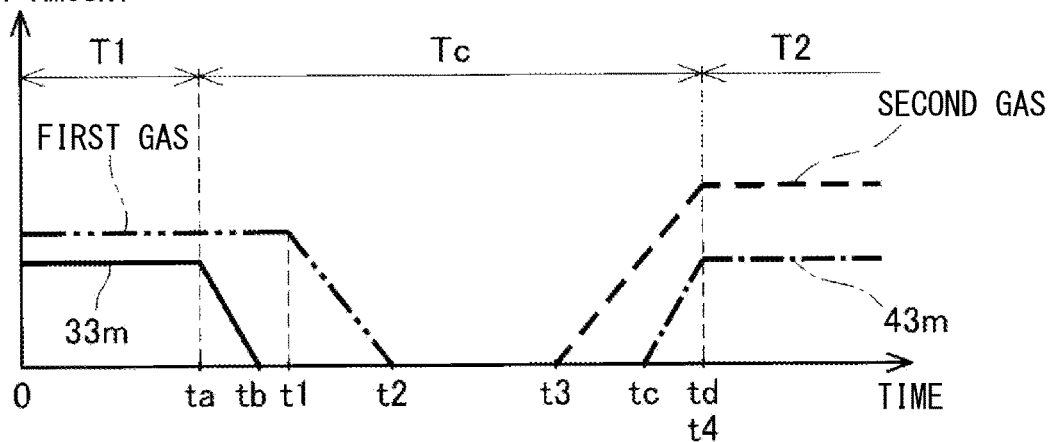
FIG. 4 is a graph illustrating an example of a control pattern of supply amounts of mist and gas during a transition period from a first processing step to a second processing step.

In the first control pattern shown in FIG. 4, the supplies of the mist and the gas into the furnace 12 are stopped during the transition period Tc. In the first control pattern, the first gas and the second gas may be the same or different.

The controller 90 starts to decrease the supply amount of the mist 33m at the end timing ta of the first processing step T1 and stops the supply of the mist 33m at the subsequent timing tb. Further, at the timings ta and tb, the controller 90 keeps the flow rate of the first gas at the same value as that in the first processing step T1. The controller 90 starts to decrease the flow rate of the first gas at the timing t1 after the timing tb and stops the supply of the first gas at the timing t2 after the timing t1. The controller 90 does not supply the mist and the gas into the furnace 12 during a period between the timing t2 and the subsequent timing t3. The controller 90 starts to supply the second gas at the timing t3 and increases the flow rate of the second gas to a stable value in the second processing step T2 at the subsequent timing t4. Further, the controller 90 starts to supply the mist 43m at the timing tc that is between the timing t3 and the timing t4 and increases the supply amount of the mist 43m to a stable value in the second processing step at the subsequent timing td. The timing td is substantially the same as the timing t4.

In case that the mist 33m having lost the moving speed drifts in the furnace 12 at the end of the first processing step T1, the mist 33m having lost the moving speed adheres to the surface of the wafer 18, and the surface state of the wafer 18 changes. As a result, a problem that the surface state of the wafer 18 cannot be controlled to a desired state may occur. In contrast, in the first control pattern, the first gas is flowing into the furnace 12 at the timing tb when the supply of the mist 33m is stopped. Thus, a small amount of the mist 33m existing in the furnace 12 at the timing tb flows through the furnace 12 at a sufficient moving speed along with the flow of the first gas. As a result, at the timing tb, the mist 33m having a sufficient moving speed adheres to the surface of the wafer 18. Therefore, it is possible to suppress the mist having lost the moving speed from adhering to the wafer 18. Therefore, the surface state of the wafer 18 can be controlled to a desired state.

Further, in case that the mist 43m that does not have sufficient moving speed adheres to the surface of the wafer 18 at the start of the second processing step T2, a problem that the surface state of the wafer 18 cannot be controlled to a desired state may occur. In contrast, in the first control pattern, the second gas is flowing into the furnace 12 at the timing tc when the supply of the mist 43m starts. Thus, a small amount of the mist 43m supplied into the furnace 12 at the timing tc flows through the furnace 12 at a sufficient moving speed along with the flow of the second gas. Therefore, at the timing tc, the mist 43m having a sufficient moving speed adheres to the surface of the wafer 18. Therefore, the surface state of the wafer 18 can be controlled to a desired state.

In FIG. 4, the timing t1 when the flow rate of the first gas starts to decrease is after the timing tb when the supply of the mist 33m is stopped. However, the timing t1 when the flow rate of the first gas starts to decrease can be arbitrary determined as long as the first gas flows thorough the furnace 12 at the timing tb. For example, the timing t1 may be before the timing tb or before the timing ta.

Further, in FIG. 4, the timing t4 when the flow rate of the second gas is increased to the stable value is the same as the timing td when the supply amount of the mist is increased to the stable value. However, the timing t4 when the flow rate of the second gas is increased to the stable value can be arbitrary determined as long as the second gas flows through the furnace 12 at the timing tc when the supply of the mist 43m is started. For example, the timing t4 may be before the timing tc, between the timing tc and the timing td, or after the timing td.

(Second Control Pattern)

Figure 5:
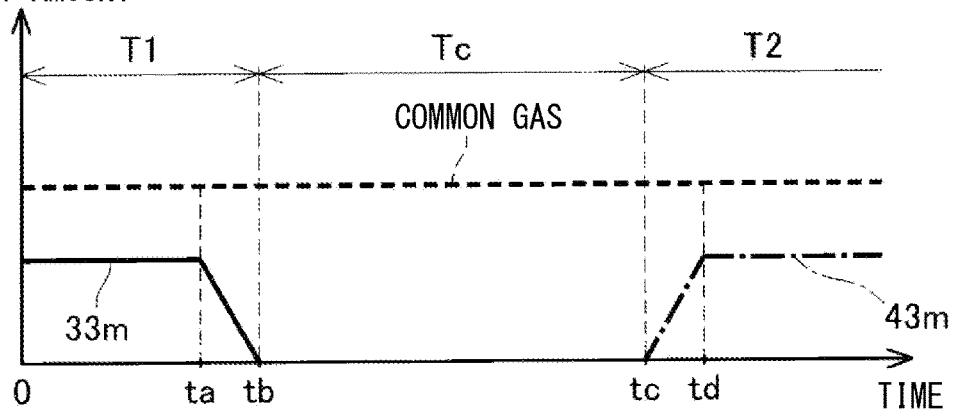
FIG. 5 is a graph illustrating an example of a control pattern of supply amounts of the mist and the gas during the transition period from the first processing step to the second processing step.

In the second control pattern shown in FIG. 5, the common gas continuously flows through the furnace 12 throughout the first processing step T1, the transition period Tc, and the second processing step T2.

The controller 90 keeps the flow rate of the common gas at a high value during a period between a timing that is before the timing to and a timing that is after the timing td. Since the common gas is flowing through the furnace 12 at the timing tb when the supply of the mist 33m is stopped, it is possible to suppress the change in the surface state of the wafer 18 at the timing tb. Further, since the common gas is flowing through the furnace 12 at the timing tc when the supply of the mist 43m starts, the surface state of the wafer 18 can be controlled to a desired state at the timing tc. Further, in the second control pattern, since the common gas is continuously flowing into the furnace 12 from the first processing step T1 to the second processing step T2, the change in the environment in the furnace 12 is small and thus it is more easy to accurately control the surface state of the wafer 18.

In FIG. 5, the supply amount of the common gas during the transition period Tc is constant, but the supply amount of the common gas may change during the transition period Tc.

(Third Control Pattern)

Figure 6:
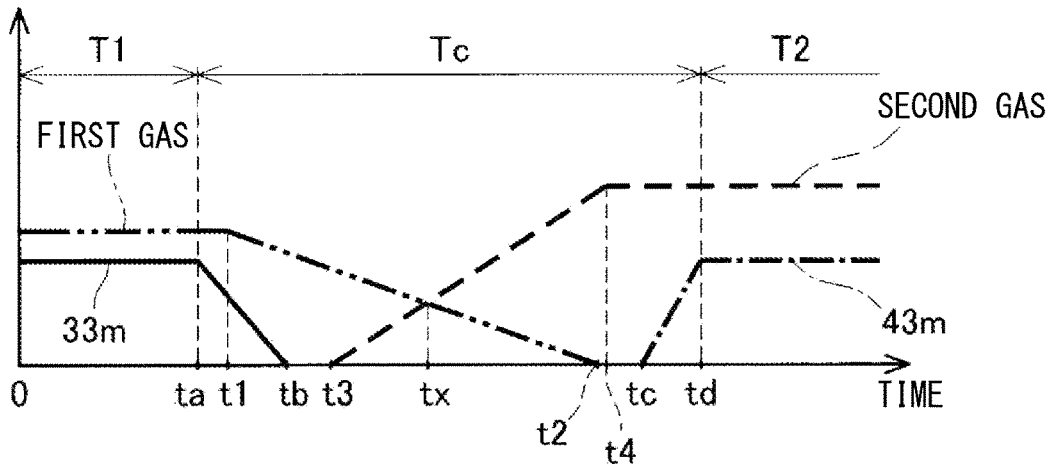
FIG. 6 is a graph illustrating an example of a control pattern of supply amounts of the mist and the gas during the transition period from the first processing step to the second processing step.

In the third control pattern shown in FIG. 6, both the first gas and the second gas are supplied into the furnace 12 during a part of the period. In the third control pattern, the first gas is different from the second gas. The timing tx shown in FIGS. 6 to 10 is a timing at which the supply amount of the second gas exceeds the supply amount of the first gas. That is, the timing tx means a timing at which the gas switching process is performed.

In the third control pattern, the timing t3 when the supply of the second gas starts is before the timing t2 when the supply of the first gas stops. That is, both the first gas and the second gas are supplied into the furnace 12 between the timing t3 and the timing t2. In FIG. 6, the timing tx when the supply amount of the second gas exceeds the supply amount of the first gas exists between the timing tb and the timing tc. The timing tb when the supply of the mist 33m stops exists before the timing t3 when the supply of the second gas starts. Thus, at the timing tb, only the first gas is flowing through the furnace 12. Therefore, it is possible to suppress the change in the surface state of the wafer 18 at the timing tb. Further, since the second gas is not supplied at the timing tb, the mist 33m and the second gas are not mixed in the furnace 12. This makes it possible to prevent an unintended reaction from occurring in the furnace 12. The timing tc when the supply of the mist 43m starts exists after the timing t2 when the supply of the first gas stops. Thus, only the second gas is flowing through the furnace 12 at the timing tc. Therefore, the surface state of the wafer 18 can be controlled to a desired state at the timing tc. Further, since the first gas is not supplied at the timing tc, the mist 43m and the first gas are not mixed with each other. This makes it possible to prevent an unintended reaction from occurring in the furnace 12. Further, in the third control pattern, gas supplied to the furnace 12 can be switched from the first gas to the second gas while gas is continuously flowing into the furnace 12 from the first processing step T1 to the second processing step T2. Since the change in the total flow rate of gas in the furnace 12 is small, it is easy to accurately control the surface state of the wafer 18.

Figure 7:
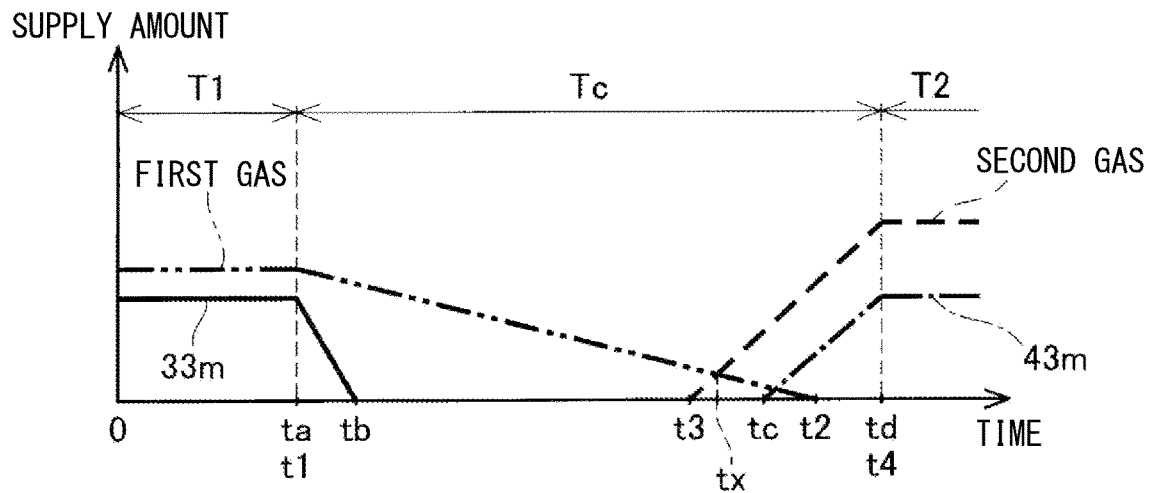
FIG. 7 is a graph illustrating an example of a control pattern of supply amounts of the mist and the gas during the transition period from the first processing step to the second processing step.
Figure 8:
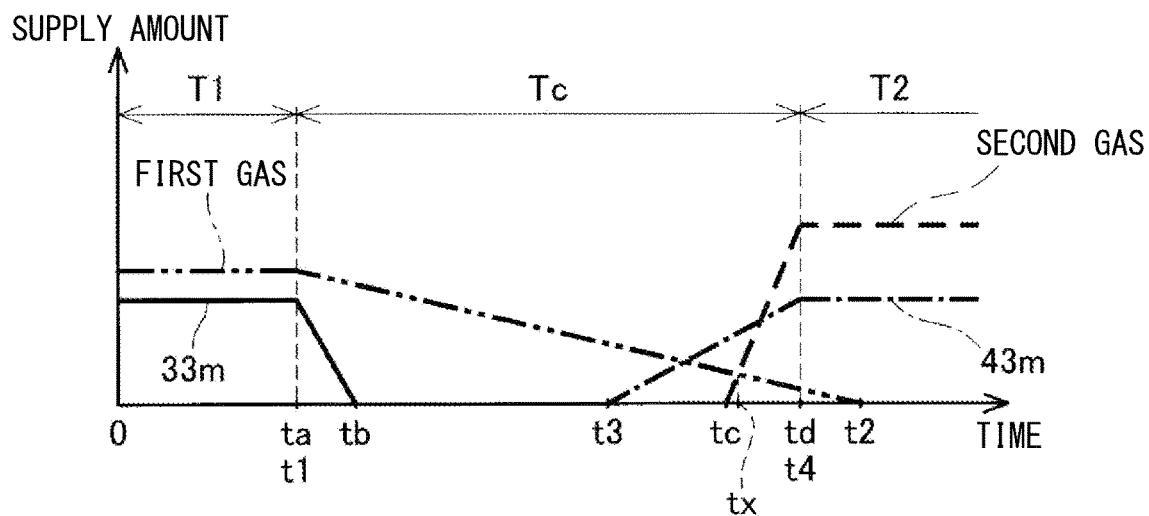
FIG. 8 is a graph illustrating an example of a control pattern of supply amounts of the mist and the gas during the transition period from the first processing step to the second processing step.
Figure 9:
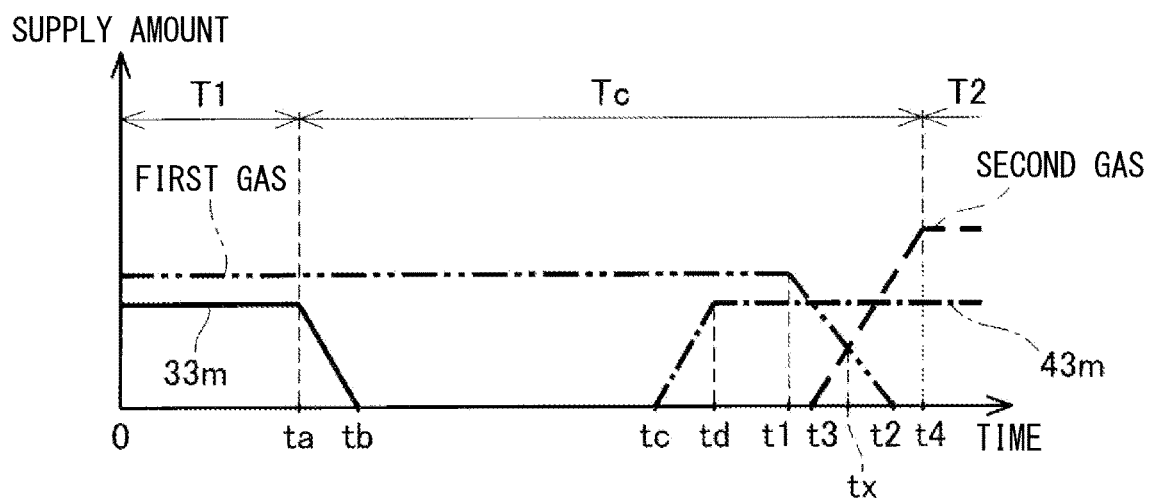
FIG. 9 is a graph illustrating an example of a control pattern of supply amounts of the mist and the gas during the transition period from the first processing step to the second processing step.
Figure 10:
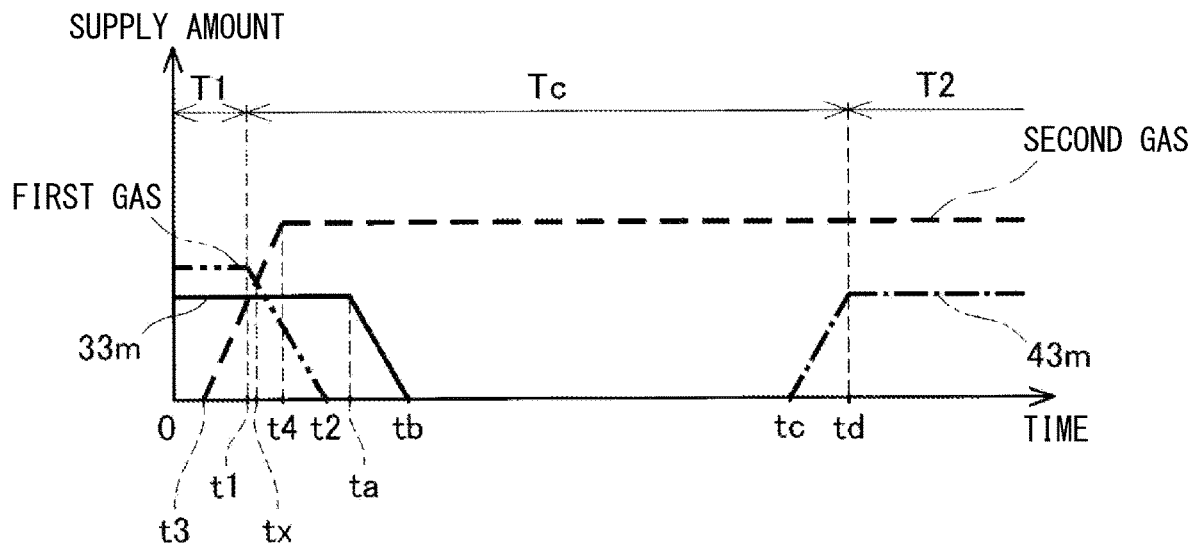
FIG. 10 is a graph illustrating an example of a control pattern of supply amounts of the mist and the gas during the transition period from the first processing step to the second processing step.

As shown in FIG. 6, a condition for overlapping the period in which the first gas is supplied with the period in which the second gas is supplied is that the timing t3 is before the timing t2. Further, the condition for supplying the first gas to the furnace 12 at the timing tb is that the timing tb is before the timing t2. Further, the condition for supplying the second gas to the furnace 12 at the timing tc is that the timing tc is after the timing t3. As long as these conditions are satisfied, each timing shown in FIG. 6 can be arbitrarily changed. For example, as shown in FIG. 7, the timing t2 may be between the timing tc and the timing td. Further, for example, as shown in FIG. 8, the timing t2 may be later than the timings td and t4. Further, for example, as shown in FIG. 9, the timings t1 and t3 may be later than the timing td. Further, for example, as shown in FIG. 10, the timings t2 and t4 may be before the timing ta.

Further, in FIGS. 4 and 6 to 10, the flow rate of the first gas during the first processing step T1 is less than the flow rate of the second gas during the second processing step T2, but the flow rate of the first gas during the first processing step T1 may be greater than or equal to the flow rate of the second gas during the second processing step T2.

Figure 11:
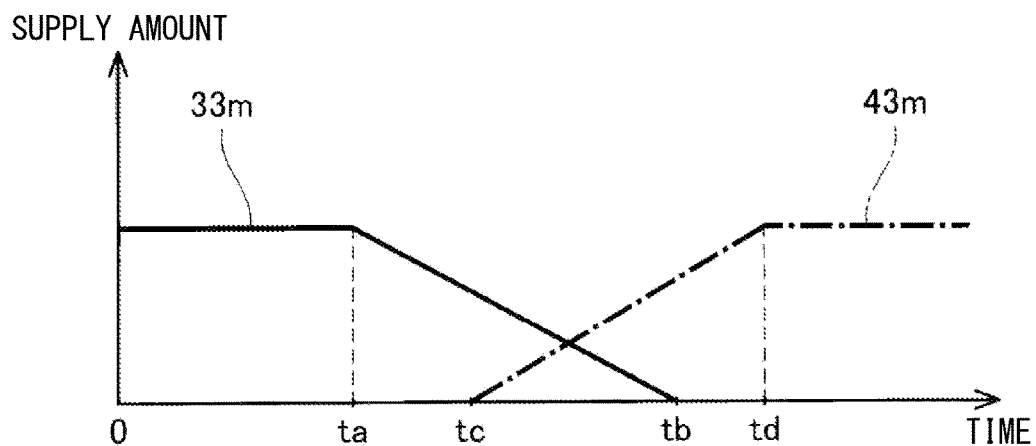
FIG. 11 is a graph illustrating an example of a control pattern of the mist during the transition period from the first processing step to the second processing step.
Figure 12:
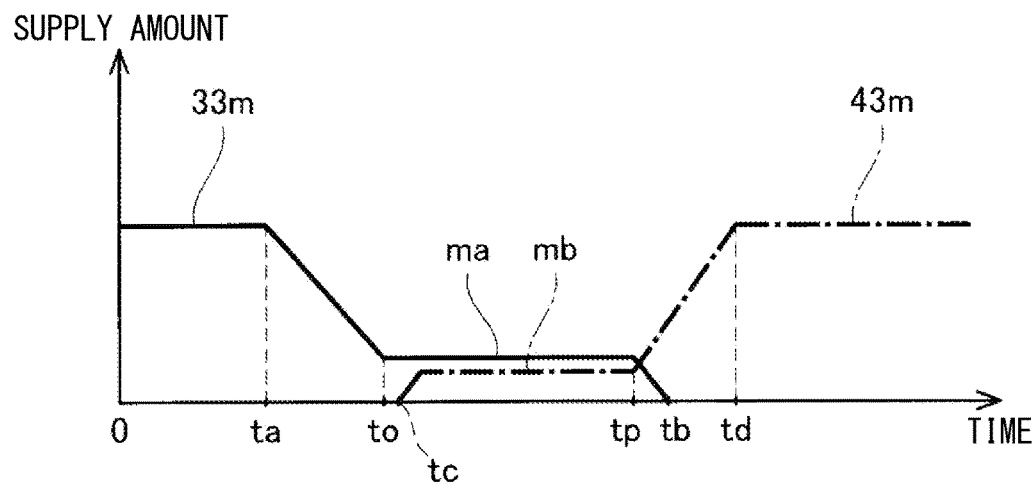
FIG. 12 is a graph illustrating an example of a control pattern of the mist during the transition period from the first processing step to the second processing step.

In FIGS. 4 to 10, the supply of the mist 43m is started after the supply of the mist 33m is stopped. According to this configuration, since the mist 33m and the mist 43m are not mixed in the furnace 12, it is possible to prevent a problem caused by mixing them. For example, it is possible to prevent mist for etching and mist for forming a film from reacting with each other. On the other hand, as shown in FIGS. 11 and 12, the supply of the mist 43m may be started before the supply of the mist 33m is stopped. That is, in FIGS. 11 and 12, since the timing tc is before the timing tb, both the mist 33m and the mist 43m are supplied into the furnace 12 during the period between the timing tc and the timing tb. That is, in FIGS. 11 and 12, the period in which the mist 33m is supplied and the period in which the mist 43m is supplied overlap with each other. Thus, during this period, a mixture of the mist 33m and the mist 43m is supplied to the furnace 12. In FIG. 11, the supply amount of the mist 33m is continuously decreasing from the timing ta to the timing tb and the supply amount of the mist 43m is continuously increasing from the timing tc to the timing td. In FIG. 12, the supply amount of the mist 33m is continuously decreasing from the timing ta to the timing to and the supply amount of the mist 33m is kept constant at a low value ma from the timing ta to the timing tb. Further, in FIG. 12, the supply amount of the mist 43m is kept constant at a low value mb from the timing tc to the timing tp and the supply amount of the mist 43m is continuously increasing from the timing tp to the timing td. The period in which the supply amount of mist 33m is kept at the value ma overlaps with the period in which the supply amount of the mist 43m is kept at the value mb. The wafer 18 may be processed by mixing the mists as shown in FIGS. 11 and 12. For example, when the mist 33m is mist that grows a film of a first material and the mist 43m is mist that grows a film of a second material, the mist 33m and the mist 43m are supplied to the furnace 12 during a period between the first processing step and the second processing step. As a result, a mixed crystal film made of the first material and the second material can be formed at an interface between the first material film and the second material film. This may reduce crystal defects at the interface. The control patterns of the mists shown in FIGS. 11 and 12 can be combined with the control patterns of the gases shown in FIGS. 4 to 10 or another patterns of the gases.

Next, concrete examples embodying the above-mentioned techniques will be described.

First Example

As the first example, a technique for forming an aluminum oxide film on the wafer 18 by using the wafer processing apparatus 10a of the first embodiment will be described. In the first example, a wafer made of a silicon single crystal is used as the wafer 18. Water (more specifically, pure water) is used as the solution 33a. An aqueous solution of aluminum acetylacetonate is used as the solution 43a. Oxygen gas is used as the carrier gas 35g. The dilution gas 36g does not used. Nitrogen gas is used as the carrier gas 45g and the dilution gas 46g.

In the initial state, the ultrasonic vibrators 32 and 42 are stopped, the flow rates of all the gases are zero, and the wafer 18 is at room temperature. Prior to the start of the first processing step, the controller 90 performs a preparing step. In the preparing step, the controller 90 supplies the carrier gas 45g and the dilution gas 46g (i.e., nitrogen gas) into the furnace 12, and then supplies the carrier gas 35g (i.e., oxygen gas) into the furnace 12. As a result, the atmosphere in the furnace 12 is discharged and replaced with the carrier gas 35g. After that, the controller 90 controls the heater 14 to heat the wafer 18 in the furnace 12 to a desired temperature while keeping supplying the carrier gas 35g into the furnace 12. When the temperature of the wafer 18 stabilizes, the controller 90 operates the ultrasonic vibrator 32. As a result, the mist 33m is generated in the solution storage tank 33, and the mist 33m is supplied to the furnace 12 together with the carrier gas 35g. As a result, the first processing step is started.

Figure 13:
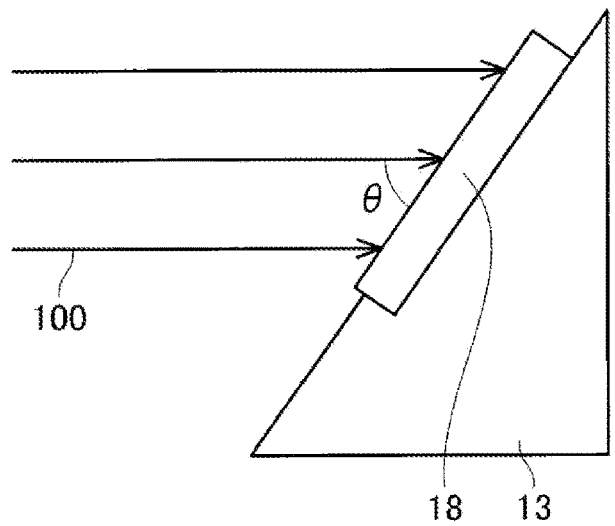
FIG. 13 is a diagram illustrating an angle between a flow direction of the mist and the surface of the wafer.

In the first processing step, the carrier gas 35g and the mist 33m of pure water are supplied into the furnace 12. The mist 33m flows through the furnace 12 together with the carrier gas 35g. As a result, the mist 33m flows through the furnace 12 as shown by arrows 100 shown in FIG. 13. As shown in FIG. 13, in the furnace 12, the surface of the wafer 18 is disposed to face the flow direction of the mist 33m (i.e., the arrows 100) and to be tilted by an angle θ relative to that direction. Thus, the mist 33m collides with the surface of the wafer 18 at an angle tilted by the angle θ relative to the surface of the wafer 18. Further, the surface of the wafer 18 is exposed to the carrier gas 35g (i.e., oxygen gas). Therefore, the surface of the wafer 18 is modified by being oxidized by oxygen atoms contained in the mist 33m and the carrier gas 35g (i.e., oxygen gas).

Figure 14:
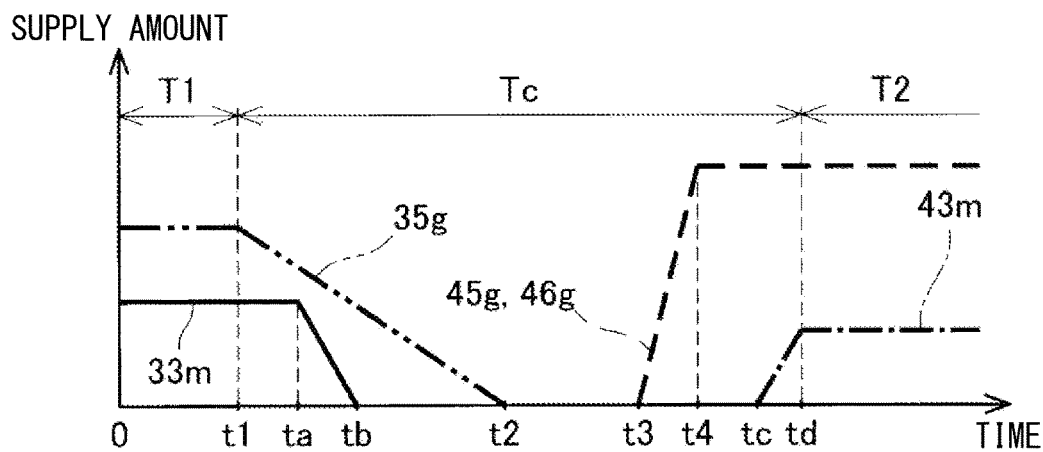
FIG. 14 is a graph illustrating a control pattern of supply amounts of the mist and the gas in the first example.

When switching from the first processing step to the second processing step, the controller 90 controls the supply amounts of the mist and the gas as shown in FIG. 14. When terminating the first processing step T1, the controller 90 starts to decrease the supply amount of the carrier gas 35g at the timing t1. Further, at the timing ta immediately after the timing t1, the controller 90 reduces the output of the ultrasonic vibrator 32. As a result, the supply amount of the mist 33m decreases after the timing ta. The controller 90 stops the ultrasonic vibrator 32 at the timing tb immediately after the timing ta to stop the supply of the mist 33m. The controller 90 reduces the supply amount of the carrier gas 35g to zero at the timing t2 after the timing tb. Thus, at the timing tb when the supply of the mist 33m is stopped, the carrier gas 35g is flowing through the furnace 12. The controller 90 does not supply gas into the furnace 12 from the timing t2 to the subsequent timing t3. The controller 90 starts to supply the carrier gas 45g and the dilution gas 46g (hereinafter referred to as the gases 45g and 46g) at the timing t3, and increases the supply amounts of the gases 45g and 46g to stable values at the subsequent timing t4. Further, the controller 90 operates the ultrasonic vibrator 42 at the timing tc after the timing t4. As a result, the mist 43m is generated in the solution storage tank 43, and the mist 43m is supplied to the furnace 12 together with the gases 45g and 46g. The controller 90 increases the output of the ultrasonic vibrator 42 after the timing tc to increase the supply amount of the mist 43m. The controller 90 increases the supply amount of the mist 43m to a stable value at the timing td after the timing tc. As a result, the second processing step T2 is started.

In the second processing step, the mist 43m flows as shown by the arrows 100 in FIG. 13, and the mist 43m collides with the surface of the wafer 18 at an angle tilted by the angle θ. When the mist 43m (i.e., the aqueous solution of aluminum acetylacetonate) adheres to the surface of the wafer 18, the mist 43m is heated by the wafer 18 and reacts. As a result, an aluminum oxide film grows on the surface of the wafer 18.

As described above, at the timing tb when the supply of the mist 33m is stopped, the carrier gas 35g is flowing through the furnace 12. Thus, a small amount of the mist 33m existing in the furnace 12 at the timing tb can flow through the furnace 12 at a sufficient moving speed. Therefore, even at the timing tb, the mist 33m collides with the wafer 18 at an angle close to the designed angle θ. Therefore, at the end of the first processing step, the surface state of the wafer 18 can be controlled to a desired state.

Further, as described above, both the gas 45g and the gas 46g flow through the furnace 12 at the timing tc when the supply of the mist 43m starts. Thus, at the start of the supply of the mist 43m, the mist 43m can flow through the furnace 12 at a sufficient moving speed, so that the mist 43m collides with the wafer 18 at an angle close to the designed angle θ. Therefore, the aluminum oxide film can be appropriately grown on the wafer 18 immediately after the start of the second processing step.

In the first example, the temperature of the wafer 18 may be changed between the first processing step and the second processing step. Further, in the first processing step and the second processing step, the flow rates of the mists and the gases can be appropriately adjusted. Although nitrogen gas is used as both of the carrier gas 45g and the dilution gas 46g in the first example, the carrier gas 45g may be different from the dilution gas 46g. Further, the switching valve 47a may be closed when supplying the carrier gas 35g and the switching valve 37a may be closed when supplying the gases 45g and 46g in order to prevent the carrier gas 35g from being mixed with the gases 45g and 46g in the passage. If mixing the carrier gas 35g with the gases 45g and 46g does not cause a serious problem, the switching valves 37a and 47a may be kept open.

Second Example

As the second example, a technique for forming a gallium oxide film and an aluminum oxide film on the wafer 18 by using the wafer processing apparatus 10b of the second embodiment will be described. In the second example, a wafer composed of a single crystal of sapphire is used as the wafer 18. An aqueous solution of gallium acetylacetonate is used as the solution 33a. An aqueous solution of aluminum acetylacetonate is used as the solution 43a. Nitrogen is used as the carrier gas 35g. Nitrogen is used as the carrier gas 45g. Oxygen is used as the gas 36xg.

In the initial state, the ultrasonic vibrators 32 and 42 are stopped, the flow rates of all the gases are zero, and the wafer 18 is at room temperature. Prior to the start of the first processing step, the controller 90 performs a preparing step. In the preparing step, the controller 90 supplies the carrier gases 35g and 45g (i.e., nitrogen gas) into the furnace 12 and then supplies the gas 36xg (i.e., oxygen gas) into the furnace 12. As a result, the atmosphere in the furnace 12 is discharged and replaced with the gas 36xg. After that, the controller 90 controls the heater 14 to heat the wafer 18 in the furnace 12 to a desired temperature while keeping supplying the gas 36xg into the furnace 12. When the temperature of the wafer 18 stabilizes, the controller 90 operates the ultrasonic vibrator 32 and starts to supply the carrier gas 35g. As a result, the mist 33m is generated in the solution storage tank 33, and the mist 33m flows into the common mist supply pipe 38 together with the carrier gas 35g. The mist 33m and the carrier gas 35g are mixed with the gas 36xg in the gas supply pipe 36x. Thus, the mist 33m is supplied to the furnace 12 together with the carrier gas 35g and the gas 36xg. As a result, the first processing step is started.

In the first processing step, the mist 33m (i.e., the mist of gallium acetylacetonate) is supplied into the furnace 12. The mist 33m flows through the furnace 12 together with the carrier gas 35g and the gas 36xg. As a result, as shown by the arrows 100 in FIG. 13, the mist 33m collides with the surface of the wafer 18 at an angle tilted by an angle θ relative to the surface of the wafer 18. When the mist 33m (i.e., the gallium acetylacetonate aqueous solution) adheres to the surface of the wafer 18, the mist 33m is heated by the wafer 18 and reacts. As a result, a gallium oxide film grows on the surface of the wafer 18.

Figure 15:
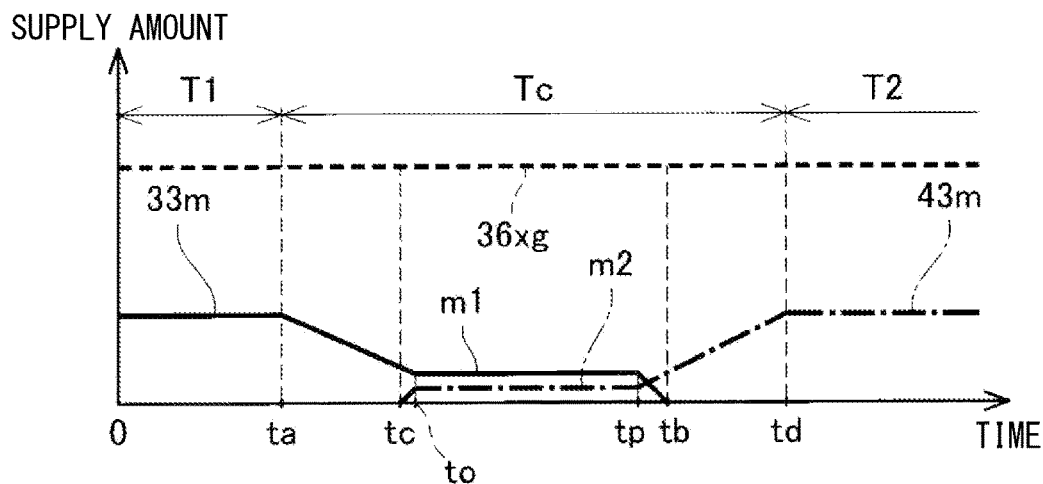
FIG. 15 is a graph illustrating a control pattern of supply amounts of the mist and the gas in the second example.

When switching from the first processing step to the second processing step, the controller 90 controls the supply amounts of the mists and the gases as shown in FIG. 15. The controller 90 maintains the flow rate of the gas 36xg at a high value from the first processing step T1 to the second processing step T2. When terminating the first processing step T1, the controller 90 reduces the output of the ultrasonic vibrator 32 at the timing ta to decrease the supply amount of the mist 33m. At the timing to, the controller 90 decreases the supply amount of the mist 33m to a value m1 that is lower than the stable value in the first processing step. After that, the controller 90 keeps the supply amount of the mist 33m at the value m1 until the timing tp. The controller 90 stops the ultrasonic vibrator 32 and stops the supply of the carrier gas 35g at the timing tb. Thus, at the timing tb, the supply of the mist 33m is stopped. Further, the controller 90 operates the ultrasonic vibrator 42 at the timing tc before the timing tb to generate the mist 43m. Further, at the timing tc, the controller 90 starts to supply the carrier gas 45g. Therefore, at the timing tc, the mist 43m is started to be supplied into the furnace 12. The controller 90 keeps the output of the ultrasonic vibrator 42 at a low output during a period from the timing ta to the subsequent timing tp, and keeps the supply amount of the mist 43m at a value m2 that is lower than a stable value in the second processing step T2. Thus, during the period between the timing tc and the timing tb, both the mist 33m and the mist 43m are supplied into the furnace 12 in low supply amounts. The controller 90 increases the output of the ultrasonic vibrator 42 at the timing tp to increase the supply amount of the mist 43m. The controller 90 increases the supply amount of the mist 43m to the stable value at the subsequent timing td. As a result, the second processing step is started.

In the second processing step, the mist 43m flows as shown by the arrows 100 in FIG. 13, and the mist 43m collides with the surface of the wafer 18 (i.e., the surface of the gallium oxide film) at an angle tilted by the angle θ. When the mist 43m (i.e., the aqueous solution of aluminum acetylacetonate) adheres to the surface of the wafer 18, the mist 43m is heated by the wafer 18 and reacts. As a result, an aluminum oxide film grows on the surface of the wafer 18. Thus, a laminated structure of the gallium oxide film and the aluminum oxide film is formed on the surface of the wafer 18.

As described above, the gas 36xg flows through the furnace 12 at the timing tb when the supply of the mist 33m is stopped. Thus, a small amount of the mist 33m existing in the furnace 12 at the timing tb can flow through the furnace 12 at a sufficient moving speed. Therefore, even at the timing tb, the mist 33m collides with the wafer 18 at an angle close to the designed angle θ. Therefore, the surface state of the wafer 18 (i.e., the surface state of the gallium oxide film) can be controlled to a desired state.

Further, as described above, the gas 36xg flows through the furnace 12 at the timing tc when the supply of the mist 43m is started. Thus, at the start of the supply of the mist 43m, the mist 43m can flow through the furnace 12 at a sufficient moving speed, so that the mist 43m collides with the wafer 18 at an angle close to the designed angle θ. Therefore, the aluminum oxide film can be appropriately grown immediately after the start of the second processing step.

Further, as described above, in the period between the timing tc and the timing tb, both the mist 33m and the mist 43m are supplied into the furnace 12 in low supply amounts. Thus, a thin mixed crystal film can be formed between the gallium oxide film and the aluminum oxide film. By forming the thin mixed crystal film at the interface between the gallium oxide film and the aluminum oxide film (i.e., at a heterojunction interface) in this way, it is possible to suppress crystal defects from occurring at the interface. The mixed crystal film can be formed more appropriately with this method when the common mist supply pipe 38 is disposed between the gas supply pipe 36x and the confluence of the mist supply pipe 37 and the mist supply pipe 47 like the wafer processing apparatus 10b of the second embodiment.

In the second example, if a mixer that mixes the mist 33m and the mist 43m while controlling the supply amounts of the mist 33m and the mist 43m is provided at the confluence of the mist supply pipe 37 and the mist supply pipe 47, the mixed crystal film such as $(Al_xGa_{1-x})_2O_3$ can be more preferably formed.

Further, when terminating the second processing step, it is preferable to stop the supply of the gas 36xg after stopping the supply of the mist 43m since the surface state of the aluminum oxide can be controlled easily.

Third Example

As the third example, a technique for forming a gallium oxide film on the wafer 18 by using the wafer processing apparatus 10c of the third embodiment will be described. In the third example, as the wafer 18, a wafer composed of a single crystal of gallium oxide is used. As the solution 33a, an acid such as hydrochloric acid, sulfuric acid or nitric acid is used. As the solution 43a, an aqueous gallium chloride solution is used. Nitrogen is used as the carrier gas 35g and the gas 36xg-1. Oxygen is used as the carrier gas 45g and the gas 36xg-2.

In the initial state, the ultrasonic vibrators 32 and 42 are stopped, the flow rates of all the gases are zero, and the wafer 18 is at room temperature. Prior to the start of the first processing step, the controller 90 performs a preparing step. In the preparing step, the controller 90 supplies the carrier gas 35g and the carrier gas 45g into the furnace 12, and then supplies the gas 36xg-1 into the furnace 12. As a result, the atmosphere in the furnace 12 is discharged and replaced with the gas 36xg-1. After that, the controller 90 controls the heater 14 to heat the wafer 18 in the furnace 12 to a desired temperature while keeping supplying the gas 36xg-1 into the furnace 12. When the temperature of the wafer 18 stabilizes, the controller 90 operates the ultrasonic vibrator 32 and starts to supply the carrier gas 35g. As a result, the mist 33m is generated in the solution storage tank 33, and the mist 33m flows into the gas supply pipe 36x together with the carrier gas 35g. In the gas supply pipe 36x, the mist 33m and the carrier gas 35g are mixed with the gas 36xg-1. Thus, the mist 33m is supplied to the furnace 12 together with the carrier gas 35g and the gas 36xg-1. As a result, the first processing step is started.

In the first processing step, the mist 33m (i.e., mist of the acid) is supplied into the furnace 12. The mist 33m flows through the furnace 12 together with the carrier gas 35g and the gas 36xg-1. As a result, as shown by the arrows 100 in FIG. 13, the mist 33m collides with the surface of the wafer 18 at an angle tilted by an angle θ relative to the surface of the wafer 18. When the mist 33m (i.e., the acid) adheres to the surface of the wafer 18, the mist 33m etches the surface of the wafer 18. As a result, defects are removed from the surface of the wafer 18.

Figure 16:
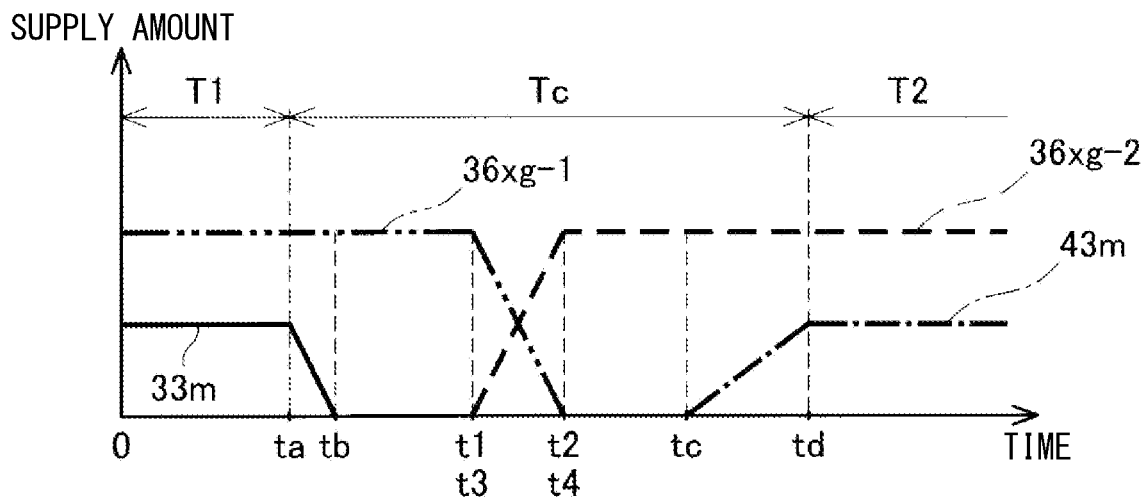
FIG. 16 is a graph illustrating a control pattern of supply amounts of the mist and the gas in the third example.

When switching from the first processing step to the second processing step, the controller 90 controls the supply amounts of the mists and the gases as shown in FIG. 16. When terminating the first processing step T1, the controller 90 reduces the output of the ultrasonic vibrator 32 at the timing ta. As a result, the supply amount of the mist 33m decreases after the timing ta. The controller 90 stops the ultrasonic vibrator 32 and the supply of the carrier gas 35g at the timing tb immediately after the timing ta to stop the supply of the mist 33m. The controller 90 keeps, at the timing tb, the supply amount of the gas 36xg-1 at a high value. Thus, the gas 36xg-1 flows through the furnace 12 at the timing tb when the supply of the mist 33m is stopped. The controller 90 starts to decrease the supply amount of the gas 36xg-1 at the timing t1 after the timing tb. The controller 90 stops the supply of the gas 36xg-1 at the timing t2 after the timing t1. Further, the controller 90 starts to supply the gas 36xg-2 at the timing t3 which is substantially the same as the timing t1. The controller 90 increases the supply amount of the gas 36xg-2 to a stable value at the timing t4 which is substantially the same as the timing t2. Thus, both the gas 36xg-1 and the gas 36xg-2 are supplied into the furnace 12 during a period between the timing t1 and the timing t2. The controller 90 operates the ultrasonic vibrator 42 and starts to supply the carrier gas 45g at the timing tc after the timing t2. Thus, at the timing tc, the supply of the mist 43m into the furnace 12 is started. The controller 90 keeps the supply amount of the gas 36xg-2 at the high value at the timing tc. Thus, the gas 36xg-2 flows through the furnace 12 at the timing tc when the supply of the mist 43m is started. The controller 90 increases the output of the ultrasonic vibrator 42 after the timing tc to increase the supply amount of the mist 43m. The controller 90 increases the supply amount of the mist 43m to a stable value at the timing td after the timing tc. As a result, the second processing step is started.

In the second processing step, the mist 43m flows as shown by the arrows 100 in FIG. 13, and the mist 43m collides with the surface of the wafer 18 at an angle tilted by the angle θ. When the mist 43m (i.e., the gallium chloride aqueous solution) adheres to the surface of the wafer 18, the mist 43m is heated by the wafer 18 and reacts with the carrier gas 45g and the gas 36xg-2 (i.e., oxygen gas). As a result, a gallium oxide film grows on the surface of the wafer 18. Since the defects are removed from the surface of the wafer 18 in the first processing step, a high quality gallium oxide film can be grown on the wafer 18.

As described above, the gas 36xg-1 flows through the furnace 12 at the timing tb when the supply of the mist 33m is stopped. Thus, a small amount of the mist 33m existing in the furnace 12 at the timing tb can flow through the furnace 12 at a sufficient moving speed. Therefore, even at the timing tb, the mist 33m collides with the wafer 18 at an angle close to the designed angle θ. Therefore, the surface state of the wafer 18 can be controlled to a desired state.

Further, as described above, the gas 36xg-2 flows through the furnace 12 at the timing tc when the supply of the mist 43m is started. Thus, at the start of the supply of the mist 43m, the mist 43m can flow through the furnace 12 at a sufficient moving speed, so that the mist 43m collides with the wafer 18 at an angle close to the designed angle θ. Therefore, the gallium oxide film can be appropriately grown immediately after the start of the second processing step.

Further, as described above, in the period between the timing t1 and the timing t2, both the gas 36xg-1 and the gas 36xg-2 flow through the furnace 12. Therefore, the gas supplied into the furnace 12 can be switched from the gas 36xg-1 to the gas 36xg-2 while keeping gas flowing through the furnace 12. Since the surface of the etched wafer 18 is always covered with the gases 36xg-1 and/or 36xg-2, the second processing step can be started while keeping the surface of the etched wafer 18 clean. In particular, in the period between the timing t1 and the timing t2, the decrease rate of the flow rate of the gas 36xg-1 is controlled to a value substantially equal to the increase rate of the flow rate of the gas 36xg-2. Thus, the total flow rate of gas flowing into the furnace 12 is maintained substantially constant within this period. Thus, the temperature of the wafer 18 is unlikely to change, and the second processing step can be started in a more stable state. Therefore, a higher quality gallium oxide film can be grown.

In the third example, since the mist 33m is the acid for etching and the mist 43m is the solution for film formation, the switching valves 37a and 47a can be used to prevent them from being mixed with each other.

Further, in the wafer processing apparatus 10c of the third embodiment, the mist supply pipe 47 is fluidly connected to the gas supply pipe 36x at a position upstream of a connecting position between the mist supply pipe 37 and the gas supply pipe 36x. The mist 33m (i.e., the mist of the acid) adheres to a portion of the inner wall of the gas supply pipe 36x on the downstream side of the mist supply pipe 37, whereas the mist 33m does not adhere to a portion of the inner wall of the gas supply pipe 36x on the upstream side of the mist supply pipe 37. Therefore, the mist 33m does not adhere to most of a portion of the inner wall of the gas supply pipe 36x on the downstream side of the mist supply pipe 47. Therefore, when the mist 43m (the mist for film formation) flows through the gas supply pipe 36x, the mist 43m is less likely to be affected by the mist 33m adhering to the inner wall. Therefore, a higher quality gallium oxide film can be grown.

Figure 17:
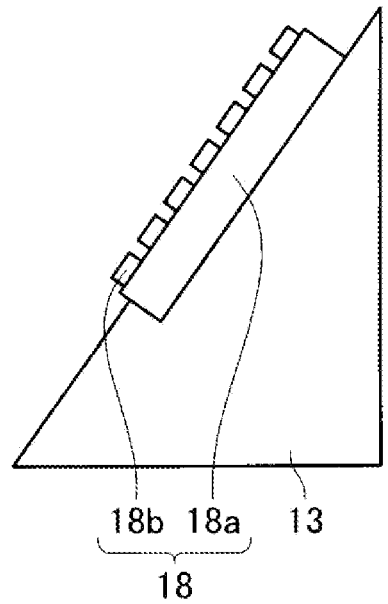
FIG. 17 is a diagram illustrating a wafer provided with a mask on the surface of the wafer.

The surface of the wafer 18 is flat in this example, but the surface of the wafer 18 may be uneven. For example, as shown in FIG. 17, when the wafer 18 is composed of a semiconductor substrate 18a and a mask 18b covering the surface of the semiconductor substrate 18a, opening portions of the mask 18b serve as recesses. It is also possible to process the wafer 18 having the recesses on the surface with a mist. For example, the opening portions of the mask 18b are selectively etched by the mist that etches the semiconductor substrate 18a, so that a trench can be formed in the semiconductor substrate 18a. In case that the wafer 18 having the recesses is processed with the mist in this way and the mist that does not have a sufficient speed adheres to the wafer 18, the solution is likely to be collected in the recesses. Thus, the wafer 18 may not be properly processed. In the wafer processing apparatus disclosed in the present disclosure, as described above, the mist can collide with the wafer 18 at an appropriate moving speed, so that the wafer 18 can be appropriately processed even when the wafer 18 has recesses.

(Pipe Connection)

At a connection position where the gas supply pipe through which only gas flows (e.g., the gas supply pipe 36x) and the mist supply pipe through which the mist flows (e.g., the common mist supply pipe 38) are connected, if these connection angles are inappropriate, the flow of the mist is disturbed at the connection position. As a result, the mist adheres to the inner wall of the pipe, and the amount of the mist supplied to the furnace 12 is reduced.

Figure 18:
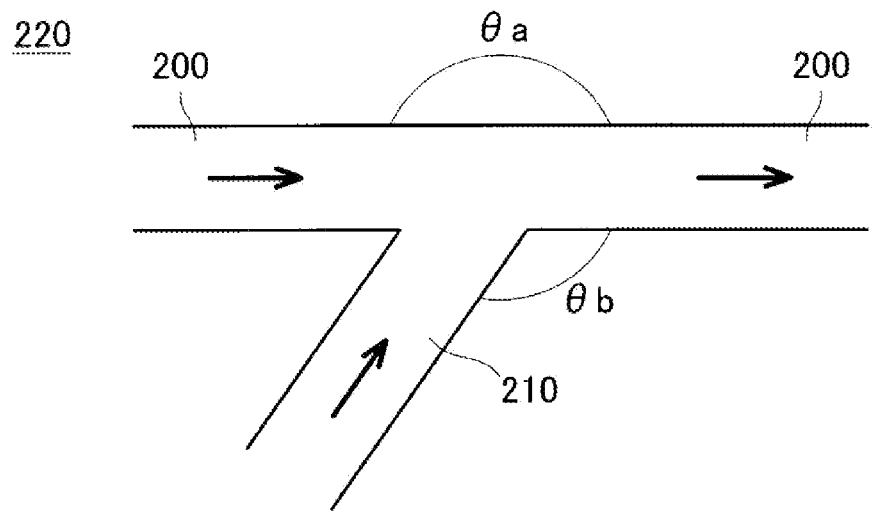
FIG. 18 is a diagram illustrating a connection angle between a gas supply pipe and a mist supply pipe.
Figure 19:
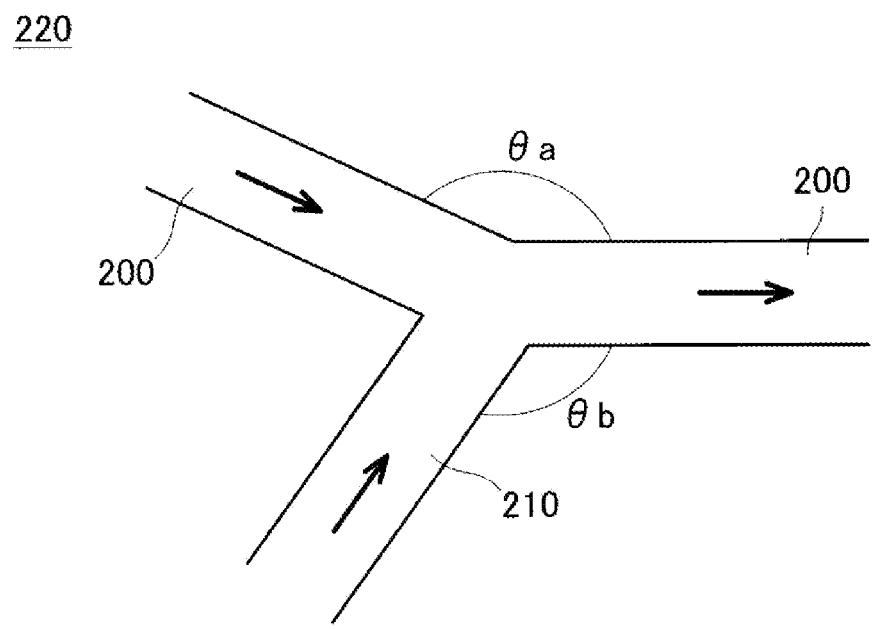
FIG. 19 is a diagram illustrating a connection angle between a gas supply pipe and a mist supply pipe.

FIGS. 18 and 19 illustrate the connection position 220 between the gas supply pipe 200 and the mist supply pipe 210. In order to suppress the turbulence of the flow of the mist at the connection position 220, the angle θa between an upstream portion of the gas supply pipe 200 on the upstream side of the connection position 220 and a downstream portion of the gas supply pipe 200 on the downstream side of the connection position 220 may be set to 135° or more. For example, as shown in FIG. 18, the upstream portion of the gas supply pipe 200 may be linearly connected to the downstream portion of the gas supply pipe 200 (i.e., θa=180°). Further, an angle θb between the mist supply pipe 210 and the downstream portion of the gas supply pipe 200 can be set to 90° or more. Further, the angle θa can be greater than the angle θb. According to this configuration, the turbulence of the flow of the mist at the connection position 220 can be suppressed.

The mist supplying device 30 of the above-described embodiments is an example of the first mist supplying device. The mist supplying device 40 of the above-described embodiments is an example of the second mist supplying device. The carrier gas supplying device 35s, the dilution gas supplying device 36s, and the gas supplying device 36xs-1 of the above-described embodiments are examples of the first gas supplying device. The carrier gas supplying device 45s, the dilution gas supplying device 46s, and the gas supplying device 36xs-2 of the above-described embodiments are examples of the second gas supplying device.

Although the embodiments have been described in detail above, these are merely examples and do not limit the scope of claims. The techniques described in claims include various modifications of the specific examples illustrated above. The technical elements described in the present disclosure or the drawings exhibit technical usefulness alone or in various combinations, and are not limited to the combinations described in the claims at the time of filing. In addition, the techniques illustrated in the present disclosure or drawings achieve a plurality of objectives at the same time, and achieving one of the objectives itself has technical usefulness.

What is claimed is:

1. A wafer processing apparatus configured to process a wafer by supplying mist to a surface of the wafer, the wafer processing apparatus comprising:
   a furnace in which the wafer is arranged;
   a gas supplying device configured to supply gas into the furnace;
   a mist supplying device configured to supply the mist into the furnace; and
   a controller, wherein
   the controller is configured to execute a processing step by controlling the gas supplying device and the mist supplying device to supply the gas and the mist into the furnace, respectively, and
   the controller is further configured to control the mist supplying device to stop supplying the mist into the furnace while controlling the gas supplying device to keep supplying the gas into the furnace when the processing step ends,
   the mist supplying device is a first mist supplying device, the mist is a first mist, and
   the processing step is a first processing step,
   the wafer processing apparatus further comprises a second mist supplying device configured to supply a second mist into the furnace, wherein
   the controller is configured to execute, after the first processing step, a second processing step by controlling the second mist supplying device and the gas supplying device to supply the second mist and the gas into the furnace, respectively,
   the controller is further configured to control the second mist supplying device to start supplying the second mist into the furnace while controlling the gas supplying device to keep supplying the gas into the furnace when the second processing step starts.

2. The wafer processing apparatus according to claim 1, wherein
   the controller is further configured to control the gas supplying device to keep supplying the gas into the furnace during a transition period between the first processing step and the second processing step.

3. The wafer processing apparatus according to claim 2, wherein
   the gas supplied by the gas supplying device during the first processing step and the gas supplied by the gas supplying device during the second processing step are a common gas, and
   the controller is further configured to control the gas supplying device to keep supplying the common gas from the first processing step to the second processing step.

4. The wafer processing apparatus according to claim 2, wherein
   the gas supplying device includes:
   a first gas supplying device configured to supply a first gas into the furnace; and
   a second gas supplying device configured to supply a second gas into the furnace, the controller is further configured to execute:
   the first processing step by controlling the first gas supplying device to supply the first gas into the furnace; and
   the second processing step by controlling the second gas supplying device to supply the second gas into the furnace,
   during the transition period from the first processing step to the second processing step, the controller is further configured to execute a gas switching control by:
   controlling the second gas supplying device to start supplying the second gas into the furnace while controlling the first gas supplying device to keep supplying the first gas into the furnace; and then
   controlling the first gas supplying device to stop supplying the first gas into the furnace while controlling the second gas supplying device to keep supplying the second gas into the furnace.

5. The wafer processing apparatus according to claim 4, wherein
the controller is further configured to execute the gas switching control after controlling the first mist supplying device to decrease an amount of the first mist supplied into the furnace.

6. The wafer processing apparatus according to claim 4, wherein
the controller is further configured to execute the gas switching control before controlling the second mist supplying device to increase an amount of the second mist supplied into the furnace.

7. The wafer processing apparatus according to claim 4, wherein
the controller is further configured to execute the gas switching control before controlling the first mist supplying device to decrease an amount of the first mist supplied into the furnace.

8. The wafer processing apparatus according to claim 4, wherein
the controller is further configured to execute the gas switching control after controlling the second mist supplying device to increase an amount of the second mist supplied into the furnace.

9. The wafer processing apparatus according to claim 1, wherein
during a transition period from the first processing step to the second processing step, the controller is further configured to:
control the first mist supplying device to stop supplying the first mist into the furnace; and then
control the second mist supplying device to start supplying the second mist into the furnace.

10. The wafer processing apparatus according to claim 1, wherein
during a transition period from the first processing step to the second processing step, the controller is further configured to:
control the second mist supplying device to start supplying the second mist into the furnace before controlling the first mist supplying device to stop supplying the first mist into the furnace; and then control the first mist supplying device to stop supplying the first mist into the furnace.

11. The wafer processing apparatus according to claim 10, wherein
during the transition period from the first processing step to the second processing step, the controller is further configured to:
decrease a supply amount of the first mist from a first value to a second value, keep the supply amount of the first mist at the second value for a first period, and then stop supplying the first mist; and
start supplying the second mist, keep a supply amount of the second mist at a third value for a second period, and then increase the supply amount of the second mist from the third value to a fourth value, and
the first period overlaps with the second period.

12. The wafer processing apparatus according to claim 1, wherein
the first processing step is a step of etching the wafer, a step of forming a film on the wafer, or a step of modifying the wafer, and
the second processing step is a step of etching the wafer, a step of forming a film on the wafer, or a step of modifying the wafer.

13. The wafer processing apparatus according to claim 1, wherein
the wafer has a surface that is tilted relative to a flow direction of the gas in the furnace.

14. A method for processing a surface of a wafer with mist, the method comprising:
supplying a first mist and a gas into a furnace in which the wafer is arranged during a first processing step;
supplying a second mist and the gas into the furnace in which the wafer is arranged during a second processing step after the first processing step;
stopping supplying the first mist into the furnace while keeping supplying the gas into the furnace when the first processing step ends; and
starting supplying the second mist into the furnace while keeping supplying the gas into the furnace when the second processing step starts.

* * * * *